(12) United States Patent
Uematsu et al.

(10) Patent No.: US 6,294,723 B2
(45) Date of Patent: *Sep. 25, 2001

(54) PHOTOVOLTAIC DEVICE, PHOTOVOLTAIC MODULE AND ESTABLISHING METHOD OF PHOTOVOLTAIC SYSTEM

(75) Inventors: Tsuyoshi Uematsu, Kodaira; Terunori Warabisako, Nishitama-gun; Yoshiaki Yazawa, Houya; Yoshinori Miyamura; Ken Tsutsui, both of Nishitama-gun; Shin-ichi Muramatsu, Kodaira; Hiroyuki Ohtsuka, Hachioji; Junko Minemura, Kokubunji, all of (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/256,454

(22) Filed: Feb. 23, 1999

(30) Foreign Application Priority Data

Feb. 26, 1998 (JP) .................................................. 10-044850

(51) Int. Cl.$^7$ ........................ H01L 31/0232; G02B 3/08; G02B 17/00; G01C 21/02; H01J 3/14
(52) U.S. Cl. .......................... 136/246; 359/726; 359/727; 359/742; 250/203.4; 250/216
(58) Field of Search ..................... 136/246, 259; 359/726, 742, 655, 664, 665, 667, 727; 126/651, 654, 663, 678, 273; 250/203.4, 216

(56) References Cited

U.S. PATENT DOCUMENTS

| | | | |
|---|---|---|---|
| 3,991,740 | * 11/1976 | Rabl | 126/270 |
| 4,056,404 | * 11/1977 | Garone et al. | 136/89 |
| 4,088,116 | * 5/1978 | Pastor | 126/270 |
| 4,099,515 | * 7/1978 | Schertz | 126/271 |
| 4,143,234 | * 3/1979 | Johnson et al. | 136/89 |
| 4,321,417 | * 3/1982 | Kurth et al. | 136/246 |

(List continued on next page.)

FOREIGN PATENT DOCUMENTS

| | | | |
|---|---|---|---|
| 6-275859 | 9/1994 | (JP) . | |
| 6-275859 | * 11/1994 | (JP) | H01L/31/052 |
| 6-511602 | * 11/1994 | (JP) | H01L/31/052 |
| 6-511602 | 12/1994 | (JP) . | |

OTHER PUBLICATIONS

13th European Photovoltaic Solar Energy Conference, Oct. 23–27, 1995, "Photovoltaic Roof Tiles", S. Wenham et al., pp. 1483–1485, 1995.*

*Primary Examiner*—Rena L. Dye
*Assistant Examiner*—Michael C. Miggins
(74) *Attorney, Agent, or Firm*—Mattingly, Stanger & Malur, P.C.

(57) ABSTRACT

Disclosed is a photovoltaic module including a plurality of concentrators each having a light-incident plane and a reflection plane, and photo detectors. Each photo detector is in contact with one of the concentrators. The module is capable of effectively trapping light and effectively generating power throughout the year even if the module is established such that sunlight at the equinoxes is made incident on the light-incident planes not in a perpendicular manner but instead obliquely, for example, in the case where the module is established in contact with a curved plane of a roof, or the like. In this module, each concentrator is formed into such a shape as to satisfy a relationship in which the light trapping efficiency of first incident light tilted rightwardly from the normal line of the light-incident plane in the cross-section including the light-incident plane, reflection plane and photo detector is larger than the light trapping efficiency of second incident light tilted leftwardly from the normal line in the above cross-section. Also, these concentrators are arranged in one direction.

20 Claims, 22 Drawing Sheets

U.S. PATENT DOCUMENTS

| | | | |
|---|---|---|---|
| 4,360,701 | * | 11/1982 | Evans, Jr. .............................. 136/259 |
| 4,395,582 | * | 7/1983 | Damsker .............................. 136/248 |
| 4,440,153 | * | 4/1984 | Melchior .............................. 126/438 |
| 5,286,305 | * | 2/1994 | Laing et al. ........................ 136/246 |
| 5,291,331 | * | 3/1994 | Miano et al. ........................ 359/598 |
| 5,646,397 | * | 7/1997 | Wenham et al. .................... 250/216 |
| 5,936,777 | * | 8/1999 | Dempewolf .......................... 359/653 |

* cited by examiner

PHOTOVOLTAIC DEVICE, PHOTOVOLTAIC MODULE AND ESTABLISHING METHOD OF PHOTOVOLTAIC SYSTEM

BACKGROUND OF THE INVENTION

1. Field of the Invention

The present invention relates to a photovoltaic device, a photovoltaic module, and a method of establishing a photovoltaic system.

2. Description of the Prior Art

A photovoltaic module that is intended to reduce the area of a photo detector by increasing a ratio of the area of a light-incident plane of a concentrator to the area of the photo detector (area of light-incident plane/area of photo detector), that is, a concentrating ratio, is disclosed, for example, in Japanese Patent Laid-open (International Publication) No. Hei 6-511602.

The cross-section of the above-mentioned photovoltaic module is shown in FIG. 3(a). A first concentrator 16 and a second concentrator 17, each of which is composed of a light-incident plane 1, a reflection plane 2, and a medium 4, are arranged laterally, symmetrically to each other. An angle formed between the light-incident plane 1 and the reflection plane 2 is made smaller than 45°, to make the concentrating ratio larger than 1, thereby making the area of a photo detector 5 smaller than that of the light-incident plane 1. The concentrating ratio can be made larger by making smaller the above angle; however, since the theoretical limit of the concentrating ratio lies at about 10, the lower limit of the above angle is set at about 5.7°.

A photovoltaic module including a cover glass portion 200 provided on first and second concentrators 16 and 17, shown in FIG. 4(a), is disclosed in a document entitled "Prototype Photovoltaic Roof Tiles, 13th European Photovoltaic Solar Energy Conference, Nice, France, October 1995, pp. 1483–1486".

This document also discloses a photovoltaic module as shown in FIG. 5(a), in which the light-receiving plane of a photo detector 5 is arranged in the direction perpendicular to the light-incident planes of the first and second concentrators 16 and 17.

The above-described prior art photovoltaic modules are each established such that the light-incident planes are tilted from the horizontal plane by an angle equivalent to the latitude of an establishing location in order to allow sunlight at the equinoxes to be made perpendicularly incident on the light-incident planes. For example, if the module is established at a location in Tokyo which lies at 34° in the northern hemisphere, the light-incident planes are tiled to the south by 34° from the horizontal plane.

For the module with no glass cover portion 200, as shown in FIG. 6, the first and second concentrators 16 and 17 are generally designed to trap sunlight incident from the narrow portion (right end) in cross-section of, for example, the concentrator 17 in the direction nearly parallel to the light-incident plane (incident angle: nearly 90°); sunlight incident at an angle which becomes small from nearly 90° to 0° (normal to the light-incident plane); and sunlight incident at an angle which becomes large from 0° to 24°. These states are illustrated on the upper sides of the first and second concentrators 16 and 17 in FIG. 6. It should be noted that the incident angle 24° corresponds to the tilt angle of the earth axis with respect to the revolution plane of the earth. The moving angles of sunlight throughout the year are illustrated on the upper side in FIG. 6.

If the photovoltaic module is established such that sunlight 400,401 at the spring equinox and sunlight 400,401 at the autumnal equinox are both made perpendicularly incident on the light-incident planes 1 as shown in FIG. 3(a), the module can effectively generate power throughout the year including a period from the spring equinox to the summer solstice 24° offset from the spring equinox and a period from the autumnal equinox to the winter solstice 24° offset from the autumnal equinox.

The photovoltaic module, however, is not necessarily established such that sunlight at the equinoxes is made usually perpendicularly incident on the light-incident planes. That is to say, the module is sometimes established in contact with a curved plane of, for example, a roof. In this case, as shown in FIG. 3(b), the sunlight 400,401 at the spring equinox and sunlight 400, 401 at the autumnal equinox are both made obliquely incident on the light-incident planes 1. As a result, the sunlight 400 is trapped by the second concentrator 17; however, the sunlight 401 is not trapped by the first concentrator 16. This cause an inconvenience in reducing the light trapping efficiency of the module.

For the module with the glass cover portion 200 as shown in FIG. 4(a), the plane causing total reflection, that is, the light-incident plane is shifted from a lower plane 32 of the cover glass sheet 200, which is equivalent to the light-incident planes of the module shown in FIG. 3(a), to an upper plane 1 of the cover glass portion 200. As a result, of the sunlight allowed to be trapped for the module with no cover glass portion 200, light 402 cannot be trapped by the module with the cover glass portion 200 and thus escapes to the outside. This causes an inconvenience in reducing the light trapping efficiency of the module. The above reduction in light trapping efficiency similarly occurs in the case where the module with the cover glass portion 200 is, as shown in FIG. 4(b), established such that sunlight at the equinoxes is not made perpendicularly incident on the light-incident plane. To be more specific, as shown in FIGS. 4(a) and 4(b), the light 402 having been made incident on the second concentrator 17 is reflected from the reflection plane 2, being subjected to total reflection from the light-incident plane 1, and enters the first concentrator 16. At this time, since the first concentrator 16 is arranged laterally symmetrically to the second concentrator 17, the incident light 402 entering the first concentrator 16 cannot be trapped in the photo detector 5 and thus escapes to the outside.

Even for the module shown in FIG. 5(a) and the module, shown in FIG. 5(b), established such that sunlight at equinoxes is not made perpendicularly incident on the light-incident planes, since first and second concentrators 16 and 17 are arranged in the same manner as that for those shown in FIGS. 3(a) and 3(b) respectively, these modules have the same problem associated with the reduction in the light trapping efficiency.

SUMMARY OF THE INVENTION

An object of the present invention is to provide a photovoltaic module including a plurality of concentrators each having a light-incident plane and a reflection plane, and photo detectors each being in contact with one of the concentrators, which is capable of effectively trapping light and effectively generating power throughout the year even if the module is established such that sunlight at the equinoxes is made incident on the light-incident planes not perpendicularly but obliquely from the right, upper side, for example, in the case where the module is established in contact with a curved plane of a roof, or the like.

To achieve the above object, according to the present invention, there is provided a photovoltaic module including: a plurality of concentrators each having a light-incident plane and a reflection plane; and photo detectors arranged such that at least part of the surface of each of the photo detectors is in contact with one of the concentrators; wherein the refractive index of the concentrator is larger than that of the environment outside the light-incident plane of the concentrator; the concentrator has such a shape as to make the light trapping efficiency of first incident light different from the light trapping efficiency of second incident light, the first incident light and the second incident light being respectively tilted rightwardly and leftwardly from the normal line of the light-incident plane in the cross-section including the light-incident plane, the reflection plane, and the photo detector; and the plurality of concentrators are arranged such that the large-and-small relationship, in the plurality of concentrators, between the light trapping efficiency of the first incident light and the trapping efficiency of the second incident light corresponds to the large-and-small relationship, in one concentrator, between the light trapping efficiency of the first incident light and the light trapping efficiency of the second incident light.

Here, the first incident light and the second incident light are only for specifying the shape of one concentrator and arrangement of a plurality of the concentrators, and therefore, they are not necessarily actual sunlight. The light trapping efficiency is defined by a ratio between light incident on the concentrator and part of the light entering the photo detector. In terms of power generation, the light trapping efficiency is defined by a ratio between the light incident on the concentrator and part of the incident light contributing to power generation. As long as a plurality of concentrators satisfy the above large-and-small relationship between the light trapping efficiencies of first incident light and second incident light, the ratio between the light trapping efficiencies may vary depending on the manner of establishing the photovoltaic module and the like.

According to the present invention, there is also provided a photovoltaic module including: a plurality of concentrators each having a light-incident plane and a reflection plane; and photo detectors arranged such that at least part of the surface of each of the photo detectors is in contact with one of the concentrators; wherein the refractive index of the concentrator is larger than that of the environment outside the light-incident plane of the concentrator; two kinds of incident light, which have been made equiangularly, symmetrically incident on the light-incident plane at two points located equidistant from an arbitrary point on the light-incident plane in the cross-section including the light-incident plane, the reflection plane and the photo detector, go along optical paths asymmetric to each other with respect to the arbitrary point; and the plurality of concentrators are arranged such that the relationship between the two kinds of incident light going along the asymmetric optical paths is given for each of the plurality of concentrators.

Here, the two kinds of incident light are only for specifying the shape of one concentrator and arrangement of a plurality of the concentrators, and therefore, they are not necessarily actual sunlight.

According to the present invention, there is also provided a photovoltaic module including: a plurality of concentrators each having a light-incident plane and a reflection plane; and photo detectors arranged such that at least part of the surface of each of the photo detectors is in contact with one of the concentrators; wherein the refractive index of the concentrator is larger than that of the environment outside the light-incident plane of the concentrator; the plurality of concentrators are connected to each other such that each of the light-incident planes is continuous to the adjacent one of the light-incident planes; and two kinds of incident light, which have been made equiangularly, symmetrically on each of the light-incident planes of the concentrators at two points located equidistant in the connecting direction from an arbitrary point on the light-incident plane, go along optical paths asymmetric to each other with respect to the arbitrary point.

Here, the two kinds of incident light are only for specifying the shape of one concentrator and arrangement of a plurality of the concentrators, and therefore, they are not necessarily actual sunlight.

The concrete forms of the photovoltaic device and photovoltaic module capable of increasing a light trapping efficiency and an establishing method of a photovoltaic system will be disclosed in preferred embodiments of the present invention to be described later.

According to the present invention, it is possible to enhance a light trapping efficiency of incident light having an asymmetric distribution and trapped by a photo detector, and also to form a photovoltaic system capable of ensuring a light trapping efficiency of incident light trapped by a photo detector even if the concentrator has, under the light-incident plane, a cover glass portion composed of only a medium.

DETAILED DESCRIPTION OF THE PREFERRED EMBODIMENTS

Hereinafter, preferred embodiments of the present invention will be described with reference to the accompanying drawings.

Figure 1:
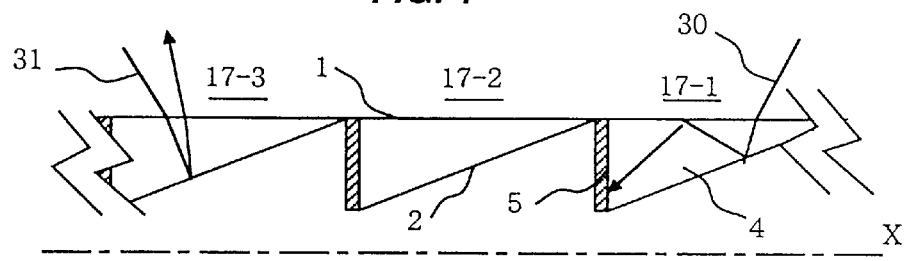
FIG. 1 is a sectional view showing the configuration of a concentrator photovoltaic module according to the present invention.
Figure 5A:
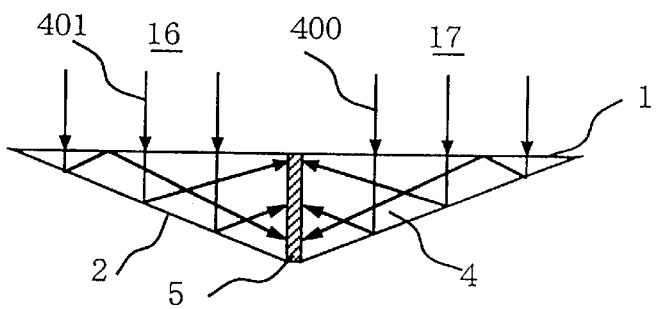
FIGS. 5(a) and 5(b) are views showing the configuration of a further prior art concentrator photovoltaic module in which a photo detector is arranged in the vertical direction.
Figure 5B:
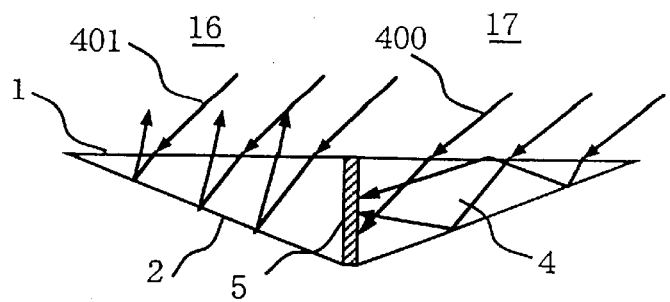

The concrete configuration of one mode of a photovoltaic module of the present invention will be described with reference to FIG. 1. In the photovoltaic module, the cross-section including light-incident planes 1, reflection planes 2, and photo detectors 3 is configured as shown in FIG. 1. To be more specific, the photovoltaic module does not include the first concentrators 16 used in the prior art module shown in FIGS. 5(a) and 5(b) but includes only second concentrators 17-1, 17-2, 17-3, . . . arranged in one direction.

Figure 6:
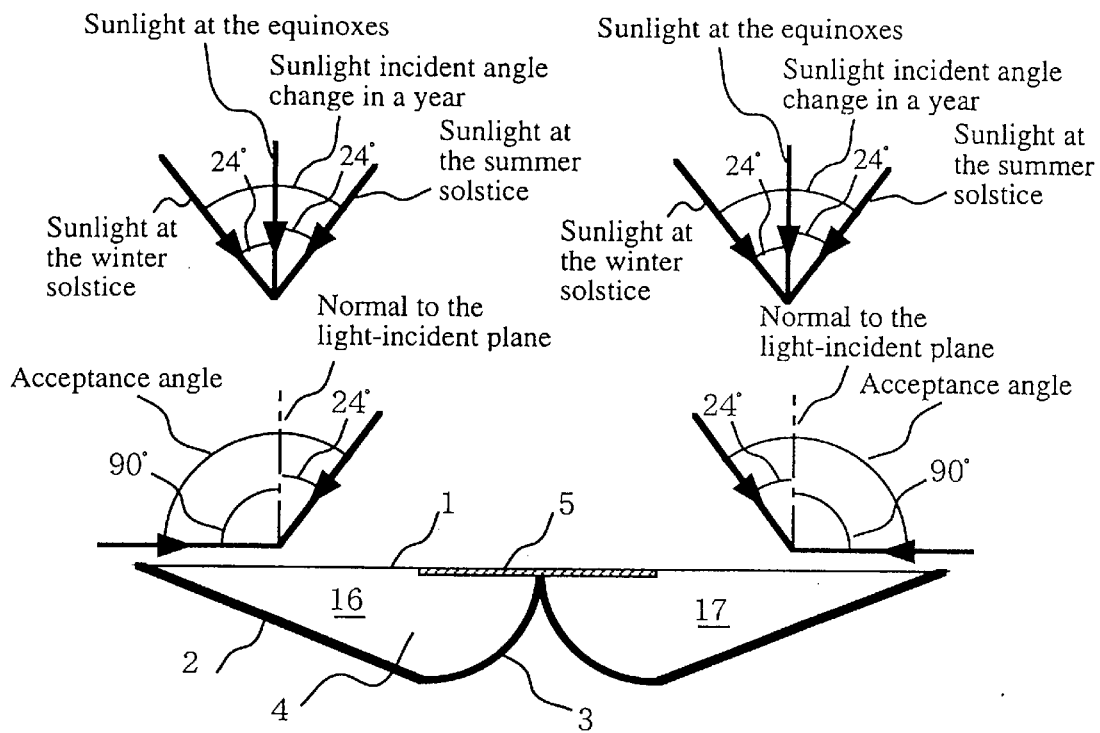
FIG. 6 is a view illustrating the incidence of sunlight on the concentrators of the prior art concentrator photovoltaic module shown in FIGS. 3(a) and 3(b)

The second concentrators 17-1, 17-2, 17-3, . . . are generally designed to trap sunlight incident from the narrow portion (right end) in cross-section of, for example, the concentrator 17-1 in the direction nearly parallel to the light-incident plane (incident angle: nearly 90°); sunlight incident at an angle which becomes small from nearly 90° to 0° (normal to the light-incident plane); and sunlight incident at an angle which becomes large from 0° to 24° (see FIG. 6).

Even if the above module is established such that sunlight 30 at the equinoxes is made incident on the light-incident plane 1 not perpendicularly but obliquely from the right, upper side of FIG. 1, for example, even if the module is established in contact with the curved plane of a roof or the like, the second concentrators 17-1, 17-2, 17-3, . . . can trap the light 30. It should be noted that in the case where the module is established in the above state, light 31 obliquely traveling from the left, upper side of FIG. 1 to the light-incident plane 1, which light is difficult to be trapped by the second concentrators 17-1, 17-2, 17-3, . . . , does not exist. In this way, the module can effectively trap incident light and effectively generate power throughout the year including a period from the spring equinox to the summer solstice 24° offset from the spring equinox and a period from the autumnal equinox to the winter solstice 24° offset from the autumnal equinox.

Even if the above module is established, like the prior art module, such that sunlight at the equinoxes is made perpendicularly incident on the light-incident planes 1, the module can effectively generate power throughout the year.

Figure 2:
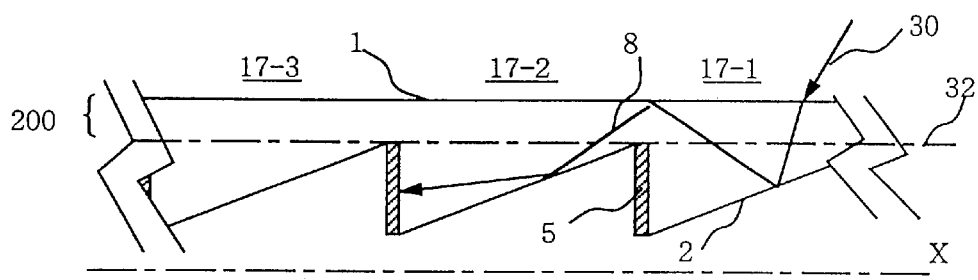
FIG. 2 is a sectional view showing the configuration of the concentrator photovoltaic module shown in FIG. 1 in which a cover glass portion is additionally provided.
Figure 3A:
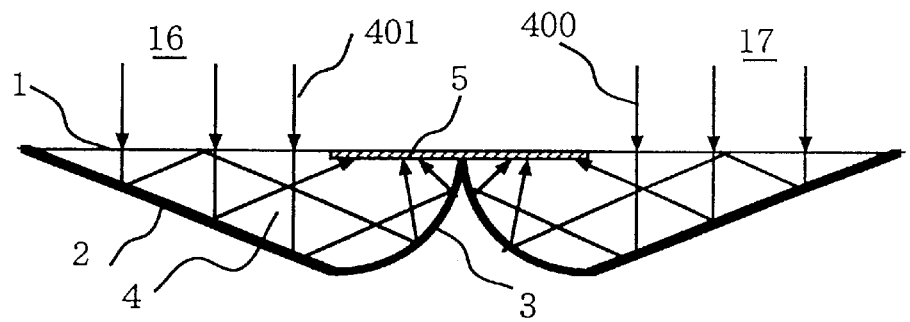
FIGS. 3(a) and 3(b) are sectional views showing the configuration of a prior art concentrator photovoltaic module.
Figure 3B:
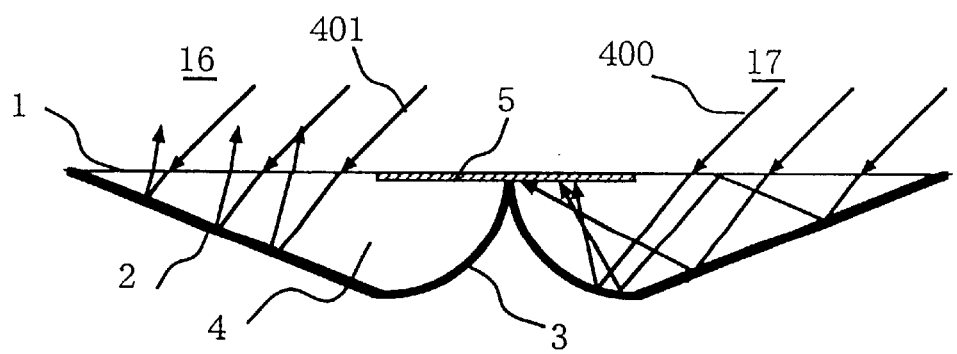
Figure 4A:
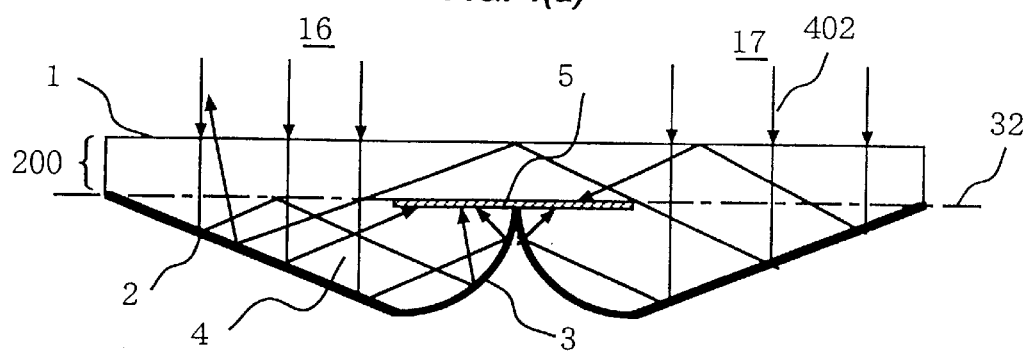
FIGS. 4(a) and 4(b) are views showing the configuration of another prior art concentrator photovoltaic module in which a cover glass portion is additionally provided.
Figure 4B:
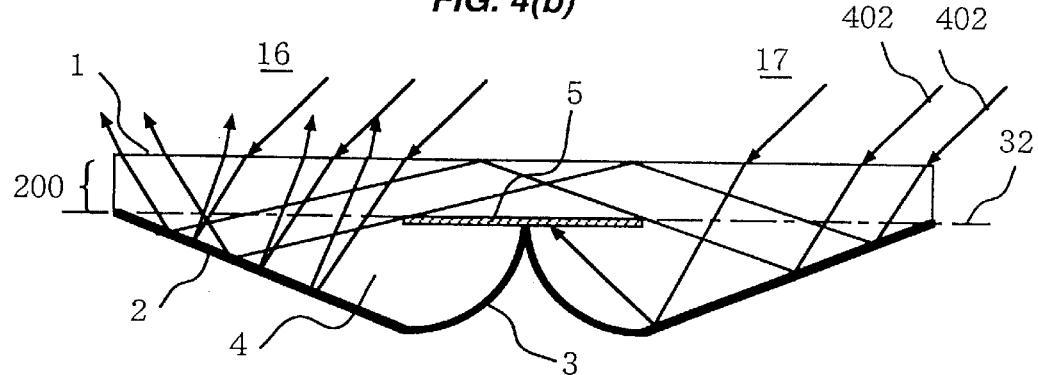

FIG. 2 is a view showing a photovoltaic module in which each of the second concentrators 17-1, 17-2, 17-3, . . . shown in FIG. 1 has on the light-incident 1 side a portion composed of only a medium 4 (hereinafter, referred to as "cover glass portion 200"). The module shown in FIG. 2 can trap light perpendicularly incident on the light-incident plane and light incident on the light-incident plane obliquely from the right, upper side, which have been difficult to be trapped by the prior art module, by the photo detector of the adjacent second concentrator. This eliminates the above problem occurring in the prior art module, which problem is associated with reduction in light trapping efficiency caused by provision of the cover glass portion 200. It should be noted that the portion composed of only the medium 4 is referred to the cover glass portion 200 on the basis of the reason that such a medium 4 is generally made from glass; however, the medium 4 may be made from a plastic material or the like.

The above description is made by example of the cross-section including the light-incident planes 1, reflection planes 2 and photo detectors 5, which cross-section is taken on the direction where the photo detectors extend vertically from the front to the back of the drawing; however, the same description can be of course made even by example of another cross-section including the light-incident planes 1, reflection planes 2 and photo detectors 5, which cross-section is tilted from the above cross-section.

Figure 7:
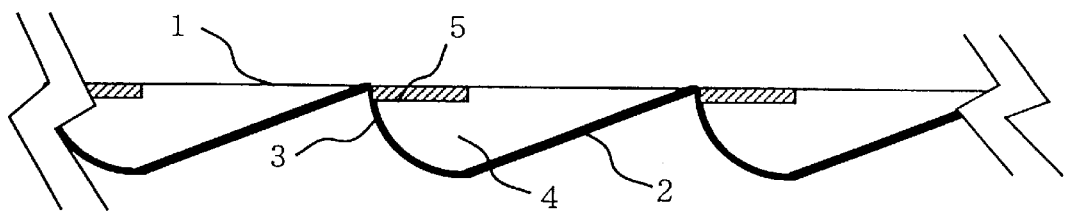
FIG. 7 is a sectional view showing the configuration of a concentrator photovoltaic module of the present invention in which a reflection plane is composed of a linear reflection plane and a circular-arc reflection plane.
Figure 8:
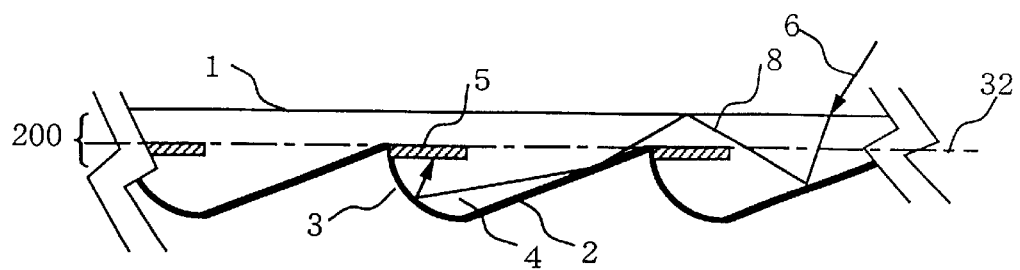
FIG. 8 is a sectional view showing the configuration of the concentrator photovoltaic module shown in FIG. 7 in which a cover glass portion is additionally provided.

Photovoltaic modules of the present invention, in each of which a reflection plane in cross-section is composed a linear reflection plane 2 and a circular-arc reflection plane 3, will be described with reference to FIGS. 7 and 8. In the module shown in FIG. 7, the back surface of the photo detector 5 is in contact with each concentrator. In the module having a cover glass portion 200 shown in FIG. 8, both the surfaces of the photo detector 5 are in contact with each concentrator. In each of the structures shown in FIGS. 7 and 8, it is effective to adopt the photo detector 5 of a bifacial type in which light is made incident on both the surfaces of the photo detector 5.

Figure 9A:
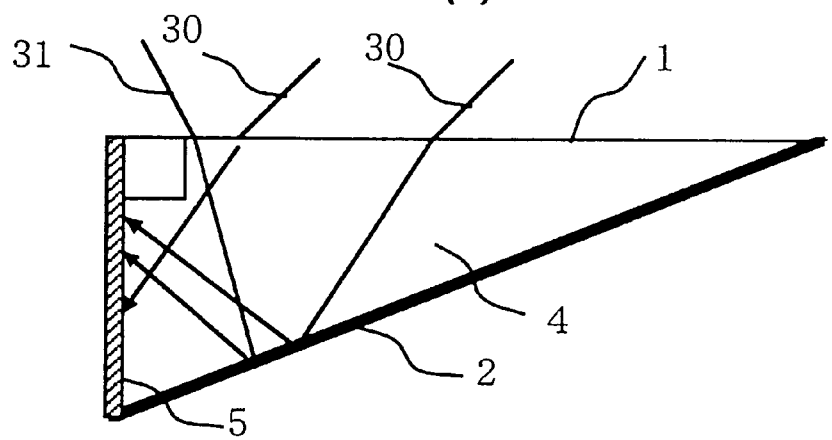
FIGS. 9(a) to 9(c) are sectional views each showing the configuration of a concentrator photovoltaic device of the present invention, which includes a concentrator composed of a linear light-incident plane and a linear reflection plane, and a photo detector perpendicular to or tilted from the light-incident plane.
Figure 9B:
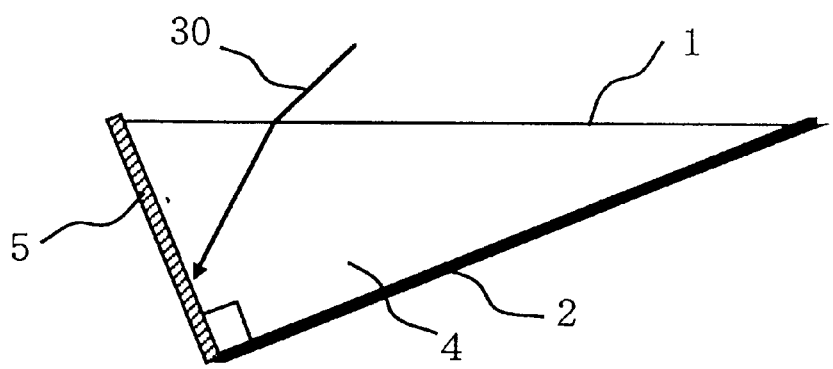
Figure 9C:
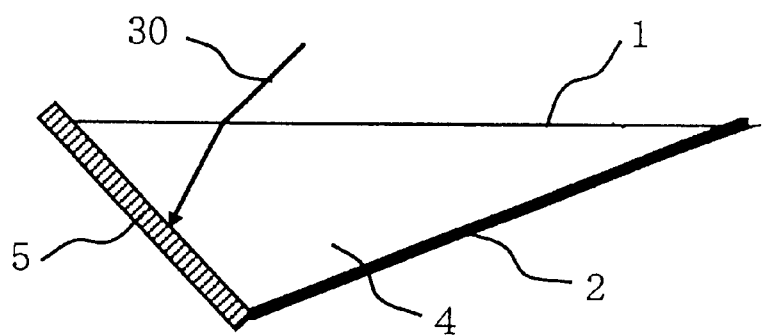

Photovoltaic devices of the present invention, each of which has a concentrator whose cross-section includes a linear light-incident plane 1, a linear reflection plane 2, and a medium 4 filling a space surrounded by the light-incident plane 1 and reflection plane 2, and which has a photo detector 5 in contact with the medium 4, will be described with reference to FIGS. 9(a) to 9(c). As shown in FIG. 9(a), with respect to a contact portion, in contact with the medium, of the photo detector, if the straight line connecting one end of the above contact portion on the light-incident plane side to the other end of the contact portion on the reflection plane side is perpendicular to the light-incident plane 1, light perpendicularly incident on the light-incident plane 1 and light 31 incident on the light-incident plane 1 obliquely from the left, upper side of the figure are all reflected from the reflection plane 2 and then made incident on the photo detector 5. In general, the spectral reflectance of the reflection plane 2 is not 100%, that is, part of the light is absorbed in the reflection plane 2. In this regard, it may be desirable to adopt a structure in which incident light is less reflected from the reflection plane 2 until it is made incident on the photo detector 5, that is, the incident light is made directly incident on the photo detector 5 as much as possible. This is effective to enhance the efficiency of trapping incident light by the photo detector, that is, the light trapping efficiency. To realize such a structure, it is effective to make the straight line connecting the above both ends of the contact portion of the photo detector not perpendicular but oblique from the light-incident plane 1 as shown in FIGS. 9(b) and 9(c). In particular, the structure shown in FIG. 9(b), in which the straight line connecting the above both ends of the photo detector 5 is perpendicular to the reflection plane 2, makes it possible to minimize the area of the photo detector 5, and hence to reduce the area of the photo detector 5 used for the concentrator photovoltaic device.

Figure 10A:
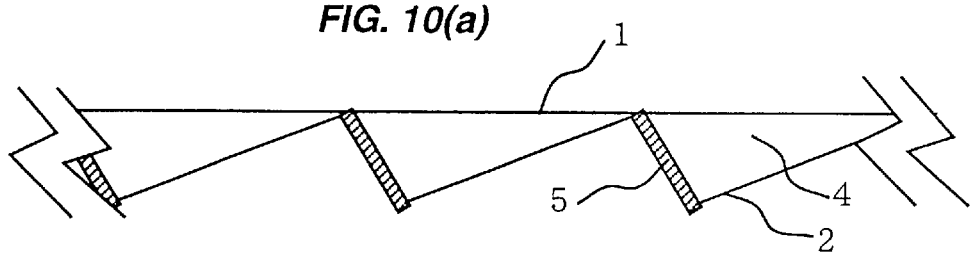
FIGS. 10(a) and 10(b) are sectional views each showing the configuration of a concentrator photovoltaic module of the present invention in which the concentrator photovoltaic devices shown in FIG. 9(b) are arranged in one direction.
Figure 10B:
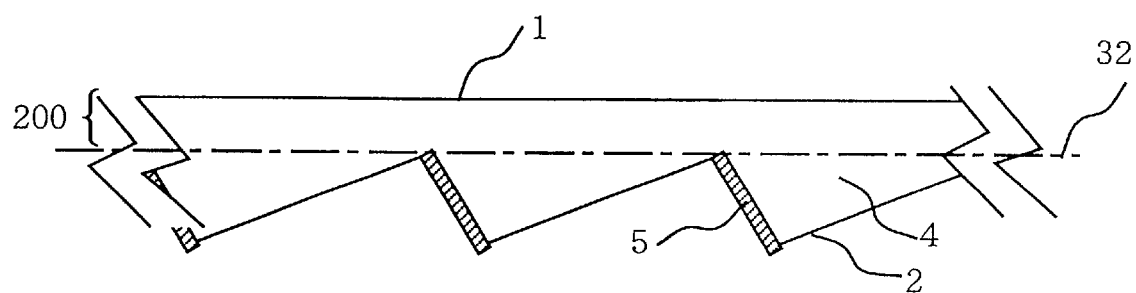

For each of the above photovoltaic devices with no cover glass portion 200, the concentrating characteristic can be improved by arranging the concentrators in the direction shown in FIG. 10(a). Similarly, for each of the above photovoltaic devices with the cover glass portion 200, the concentrating characteristic can be improved by arranging the concentrators in the direction shown in FIG. 10(b).

Figure 11A:
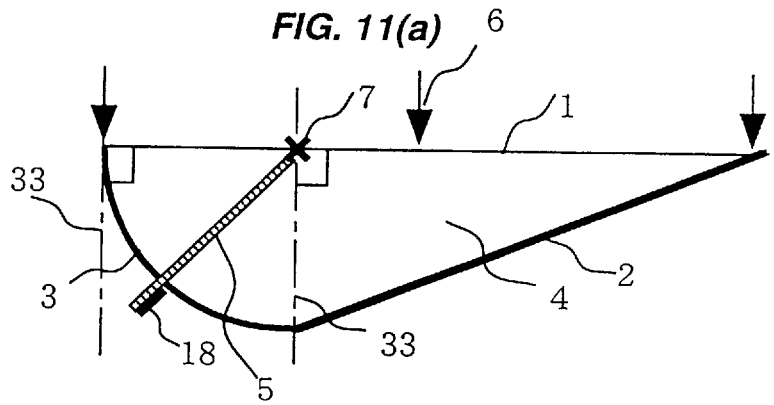
FIGS. 11(a) to 11(d) are sectional views each showing the configuration of a concentrator photovoltaic device of the present invention in which a reflection plane in cross-section forms a straight line and a circular-arc.
Figure 11B:
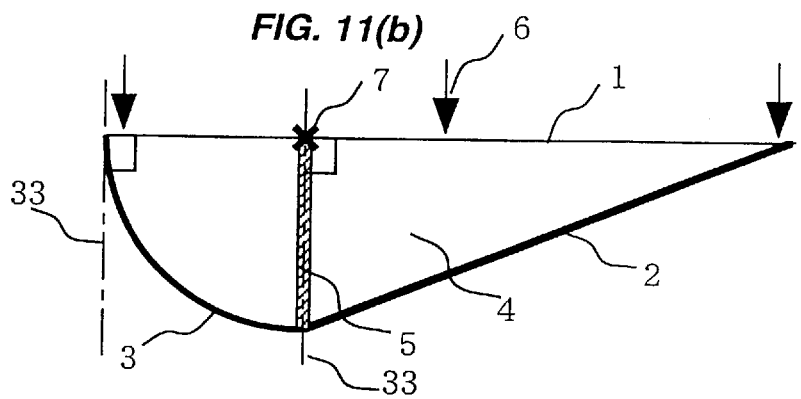
Figure 11C:
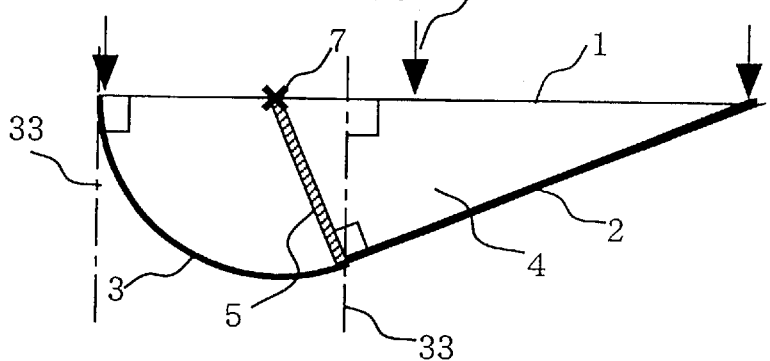
Figure 11D:
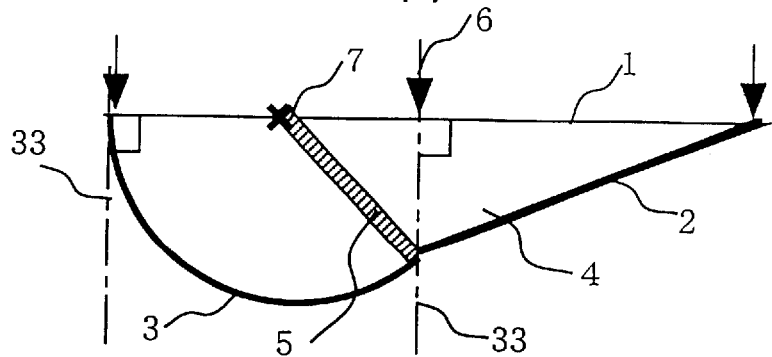

Photovoltaic devices of the present invention, each including a concentrator in which a reflection plane in cross-section is composed of a linear reflection plane and a circular-arc reflection plane, will be described with reference to FIGS. 11(a) to 11(d). In each structure, a circular-arc reflection plane 3 exists in a space surrounded by two straight lines which are perpendicular to a light-incident plane 1 and pass through both ends of the circular-arc reflection plane 3. For the concentrator having such a structure, if a photo detector 5 is arranged in parallel to the light-incident plane 1, there may occur an inconvenience. That is to say, when a plurality of the concentrators are modularized, an electrode 18 formed on the photo detector in one concentrator is brought in contact with the adjacent concentrator. Consequently the plurality of concentrators cannot be closely arranged. On the contrary, for the modules shown in FIGS. 11(a) to 11(d), since the photo detector 5 is arranged obliquely from the photo-incident plane 1, it is possible to prevent the electrode 18 in one concentrator from being brought in contact with the adjacent concentrator and hence to closely arrange a plurality of the concentrators. Even in this case, if the straight line connecting the center 7 of the circle constituting part of the circular-arc reflection plane 3 to the end, on the reflection plane 2 side, of the circular-arc reflection plane 3 is perpendicular to the reflection plane 2 as shown in FIG. 11(c), the radius of the circular-arc of the circular-arc reflection plane 3 is minimized. This makes it possible to minimize the area of the photo detector 5.

Figure 12A:
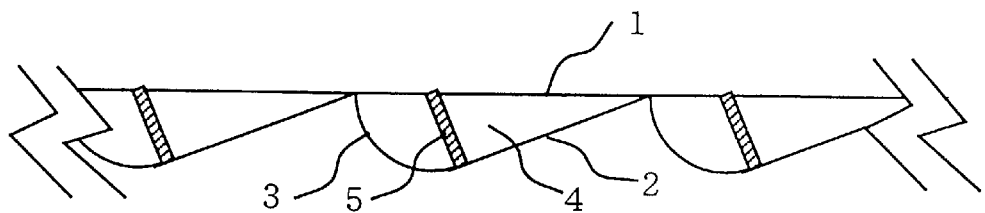
FIGS. 12(a) and 12(b) are sectional views each showing the configuration of a concentrator photovoltaic module of the present invention in which the concentrator photovoltaic devices shown in FIG. 11(c) are arranged in one direction.
Figure 12B:
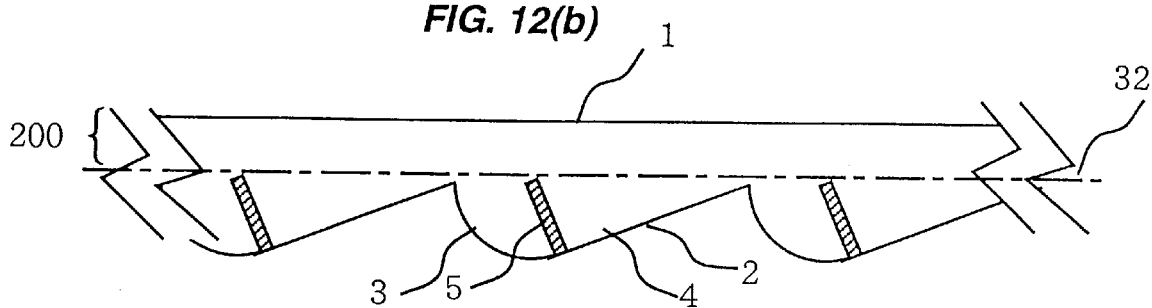

For each of the above photovoltaic devices with no cover glass portion 200, the concentrating characteristic can be improved by arranging the concentrators in the direction shown in FIG. 12(a). Similarly, for each of the above photovoltaic devices with the cover glass portion 200, the concentrating characteristic can be improved by arranging the concentrators in the direction shown in FIG. 12(b).

A photovoltaic device of the present invention, including a concentrator in which a reflection plane in cross-section is composed of a linear reflection plane and a circular-arc reflection plane, will be described with reference to FIGS. 13(a) and 13(b). The device has a sectional structure capable of increasing the ratio of the area of a light-incident plane 1 to the area of a photo detector 5 (area of light-incident plane/area of photo detector), that is, increasing the concentrating ratio. In this structure, at least part of the circular-arc reflection plane 3 of the concentrator includes an additional circular-arc reflection plane 3 positioned outside a region surrounded by two straight lines 33 which are perpendicular to the light-incident plane 1 and pass Ada through both the ends of the circular-arc reflection plane 3. With this structure, it is possible to make the radius of the photo detector 5 smaller than that of the photo detector 5 in the structure shown in FIGS. 11(a) to 11(d), and hence to reduce the area of the photo detector 5. In addition, it is ideal to mount the photo detector 5 on the radius of the circular-arc of the circular-arc reflection plane 3. In this structure, as shown in FIGS. 14(a) to 14(d), the photo detector 5 can be arranged along a line connecting one end of the circular-arc reflection plane 3 to the rotational center 7 of the circular-arc reflection plane 3, or the photo detector 5 can be arranged along a line connecting a point other than the end of the circular-arc reflection plane 3 to the rotational center 7. Also as shown in FIG. 14(c), the photo detector 5 may be arranged such that the straight line connecting the end, on the reflection plane 2 side, of the circular-arc reflection plane 3 to the rotational center 7 is perpendicular to the linear reflection plane 2. This is effective to maximize the concentrating ratio.

Figure 15A:
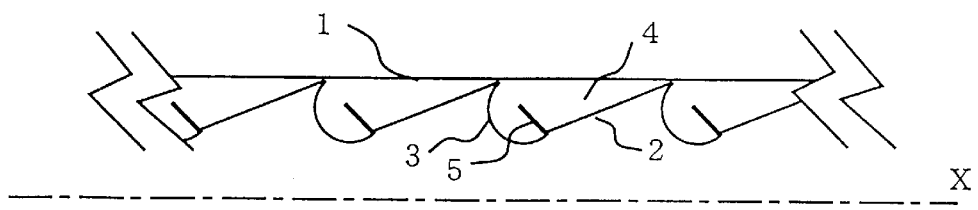
FIGS. 15(a) to 15(b) are sectional views each showing the configuration of a concentrator photovoltaic module of the present invention in which the concentrator photovoltaic devices shown in each of FIGS. 13(a), 13(b) and FIGS. 14(a) to 14(d) are arranged in one direction.
Figure 15B:
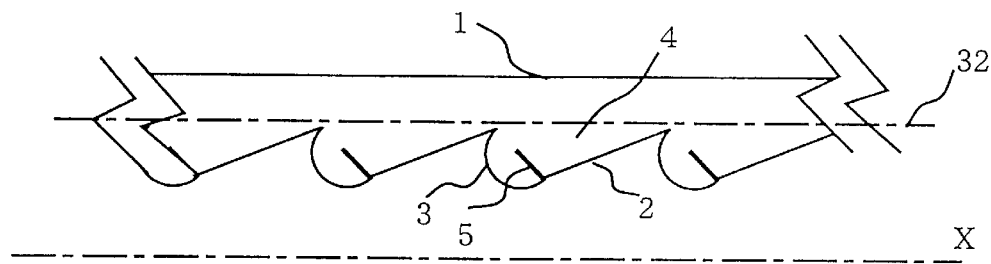

For each of the above photovoltaic devices with no cover glass portion 200, the concentrating characteristic can be improved by arranging the concentrators in the direction shown in FIG. 15(a). Similarly, for each of the above photovoltaic devices with the cover glass portion 200, 3, the concentrating characteristic can be improved by arranging the concentrators in the direction shown in FIG. 15(b).

Figure 16:
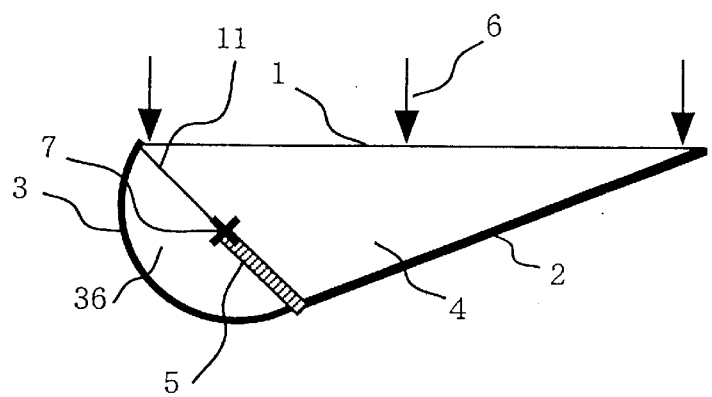
FIG. 16 is a sectional view showing the configuration of a concentrator photovoltaic device of the present invention in which a second medium is provided in addition to a first medium.

In the concentrators described above, the medium 4 is specified only in that the refractive index thereof is larger than that of the environment outside the light-incident plane. The medium 4, however, is sometimes composed of a plurality of parts, or it is sometimes composed of a plurality of regions different in refractive index. For example, as shown in FIG. 16, a portion inside a boundary 11 of a circular-arc reflection plane 3 can be formed of a second medium 36. In this case, the second medium 36 is formed separately from the medium 4 and is then bonded to the medium 4 with an adhesive, to form a concentrator. In the case where the medium is composed of a combination of separate parts, if the parts are made from the same material, the refractive indexes of the parts are identical to each other; however, if the parts are made from different materials, the refractive indexes of the parts are different from each other. Even in the latter case, if the refractive index of each part is larger than that of the environment outside the light-incident plane, it is possible to obtain the same optical characteristics of the concentrator as those described above. However, in order to make the light trapping efficiency higher, it is desirable to increase the refractive index of each part constituting the medium. Also, in the case where the adhesive is sufficiently thin, the refractive index of the adhesive may be smaller than that of the peripheral medium; however, it may be desirable that the adhesive be made from a material having a refractive index near that of the peripheral medium. If the medium is made from transparent glass or transparent plastic, the refractive index of the medium is generally in a range of about 1.45 to 1.55.

Figure 17:
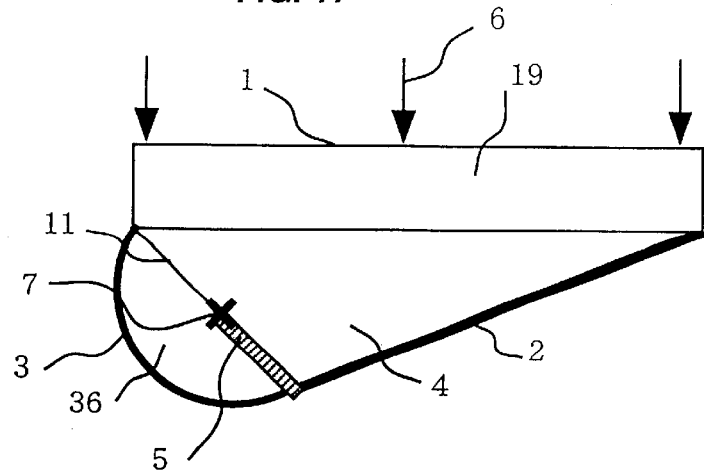
FIG. 17 is a sectional view showing the configuration of a concentrator photovoltaic device of the present invention in which the concentrator photovoltaic device shown in FIG. 16 is provided with a cover glass portion.
Figure 18:
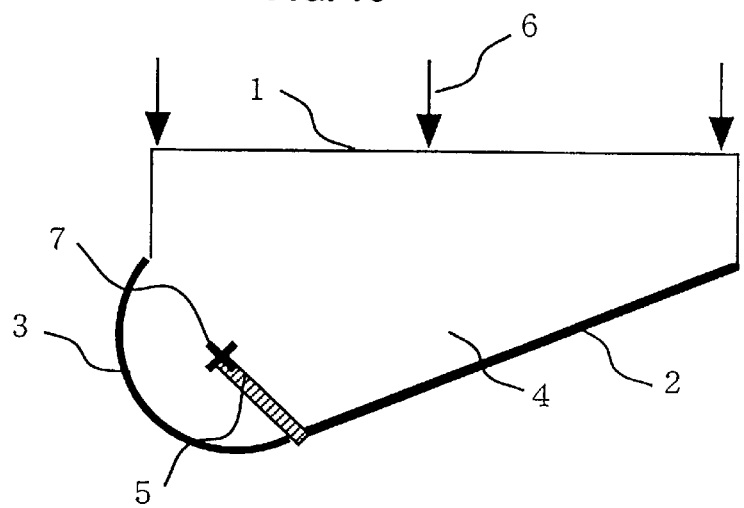
FIG. 18 is a sectional view showing the configuration of a concentrator photovoltaic device of the present invention in which a cover glass portion is integrated with one or more of media.

FIG. 17 is a sectional view showing the configuration of a photovoltaic device of the present invention in which the photovoltaic device shown in FIG. 16 is provided with a cover glass sheet 19. In this example, the cover glass portion is configured as the separate cover glass sheet 19 which is combined with the triangular medium 4 and the circular-arc second medium 36. FIG. 18 is a sectional view showing the configuration of a photovoltaic device of the present invention in which a cover glass portion is integrated with the other medium 4 portion. In this way, the medium may be made from a plurality of materials or formed of regions having different refractive indexes, or it may be made from a single material. Also, if there exists a local portion, such as an adhesive layer, having a small refractive index, the same effect of the present invention can be obtained. In this way, respective parts of the medium are not required to exhibit the same refractive index, and they may be made from different materials such as glass, plastic and oil. Also each part of the medium, described above, may be further divided into sections made from different materials or into sections having different optical characteristics such as refractive indexes.

A photovoltaic device of the present invention, including a photo detector 5 formed into a circular shape in cross-section, will be described with reference to FIG. 19. If the photo detector formed into a spherical or cylindrical shape is provided in the concentrator having the shape shown in FIGS. 11(a) to 11(d), the cross-section of the concentrator including the photo detector 5 becomes that shown in FIG. 19. In the example shown in FIG. 19, the entire photo detector exists in the concentrator; however, part of the concentrator may project outward from the concentrator.

Figure 13A:
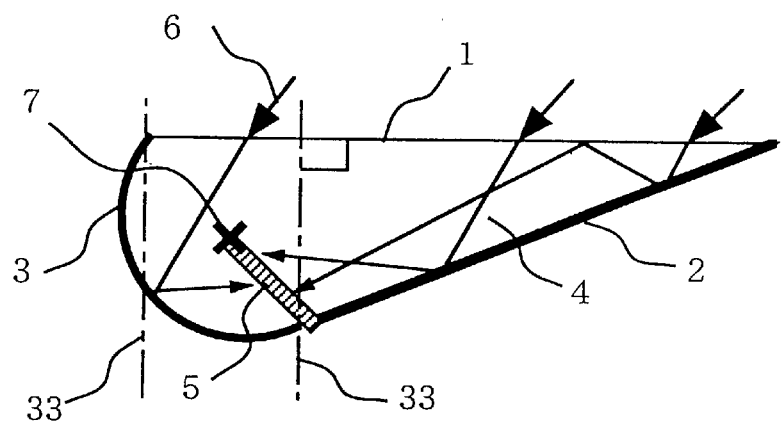
FIGS. 13(a) and 13(b) are sectional views each showing the configuration of a concentrator photovoltaic device of the present invention, which includes a reflection plane whose cross-section forms a straight line and a circular-arc, wherein the device is modified to increase the concentrating ratio by reducing the radius of the photo detector.
Figure 13B:
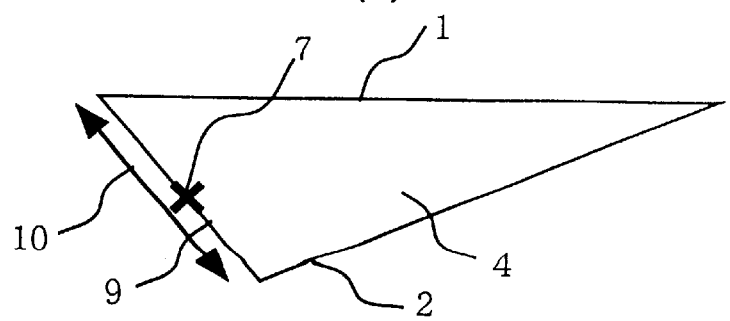
Figure 14A:
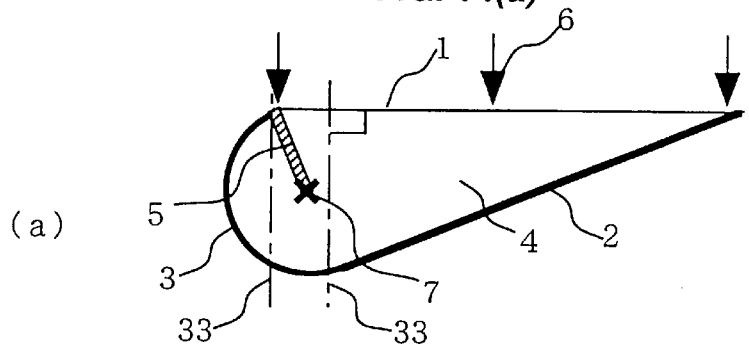
FIGS. 14(a) to 14(d) are sectional views each showing the configuration of a concentrator photovoltaic device of the present invention in which the device is modified to increase the concentrating ratio by changing the arrangement of the photo detector.
Figure 14B:
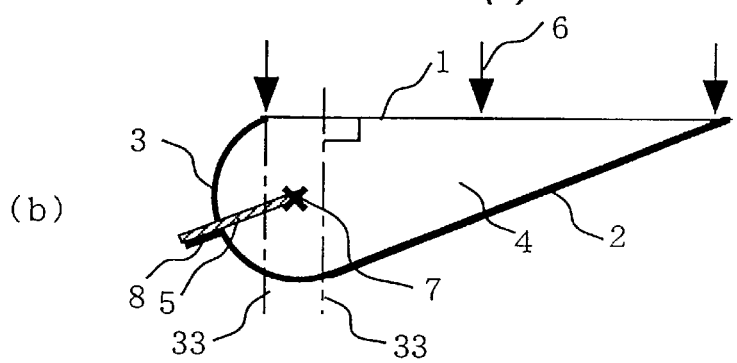
Figure 14C:
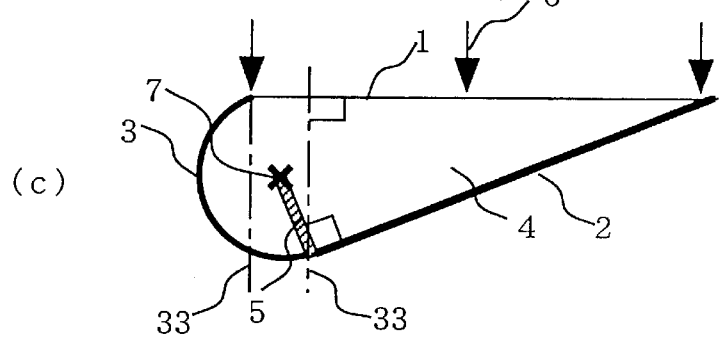
Figure 14D:
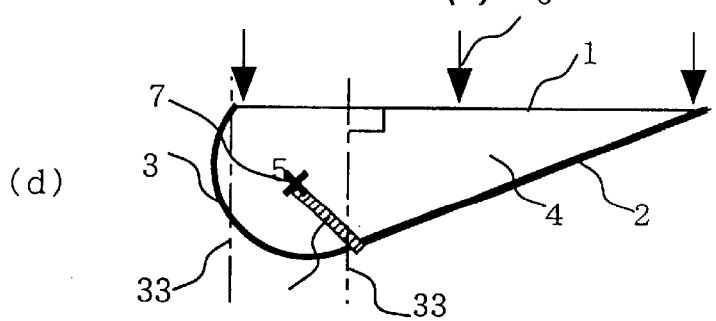
Figure 19:
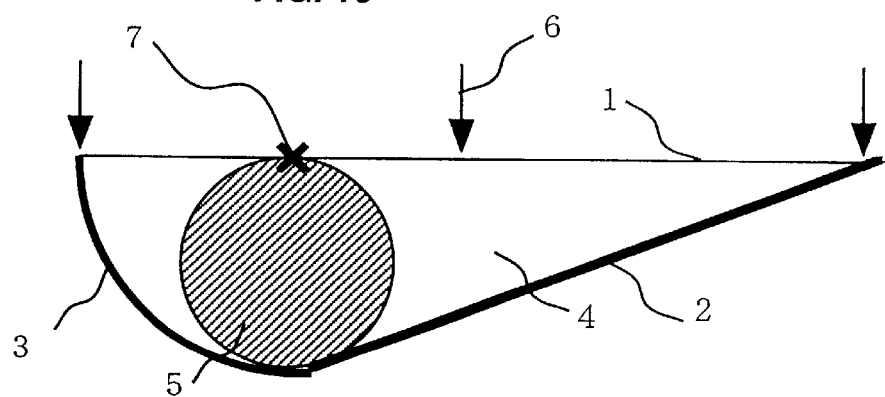
FIG. 19 is a sectional view showing the configuration of a concentrator photovoltaic device of the present invention in which a photo detector is formed into a circular shape in cross-section.
Figure 20:
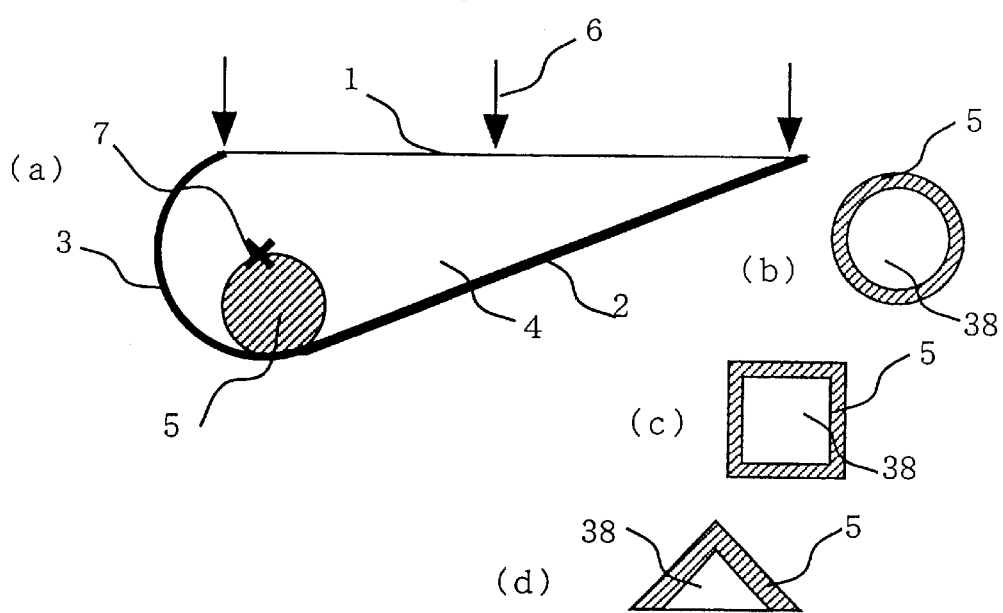
FIGS. 20(a) to 20(d) are sectional views each showing the configuration of a concentrator photovoltaic device of the present invention in which the concentrator photovoltaic device shown in FIG. 13(a) is formed into a two-dimensional shape in cross-section.

FIG. 20(a) shows an example in which the photo detector 5 shown in FIG. 19 is provided in the photovoltaic device shown in FIGS. 13(a) and 13(b). Further, as shown in FIGS. 20(b), 20(c) and 20(d), the photo detector 5 may be formed into another two-dimensional shape in cross-section, such as a circular, rectangular or triangular shape containing a hollow portion 38. Such a structure of the photo detector 5, containing the hollow portion 38, is effective to cool the photo detector with a fluid flowing through the hollow portion 38 or to collect the heat generated from the photo detector through the hollow portion 38. If the photo detector is configured as a photoelectric transducer composed of a semiconductor device, the output is generally enhanced by cooling the photo detector. In this case, the output of the photo detector can be enhanced by cooling the photo detector with water as the fluid flowing through the hollow portion 38. In addition to this, the photo detector having the hollow portion 38 can be used as a hot water preparation device. In this case, the photo detector may be formed into a circular, rectangular, or triangular shape having the hollow portion 38 shown in FIGS. 20(b), 20(c) and 20(d). The photoelectric transducer 5 may be formed over the entire surface or on part of the surface.

Figure 21:
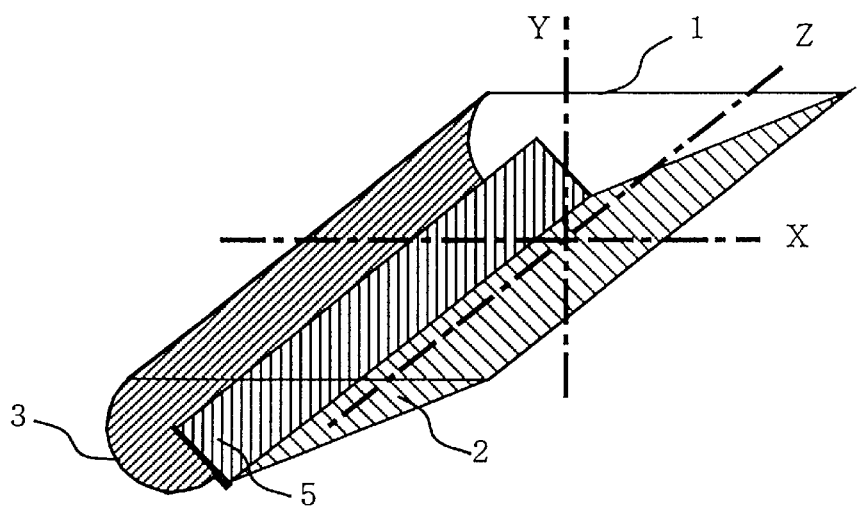
FIG. 21 is a view three-dimensionally showing the structure of the concentrator photovoltaic device, for example, shown in FIGS. 14(a) to 14(d)
Figure 22A:
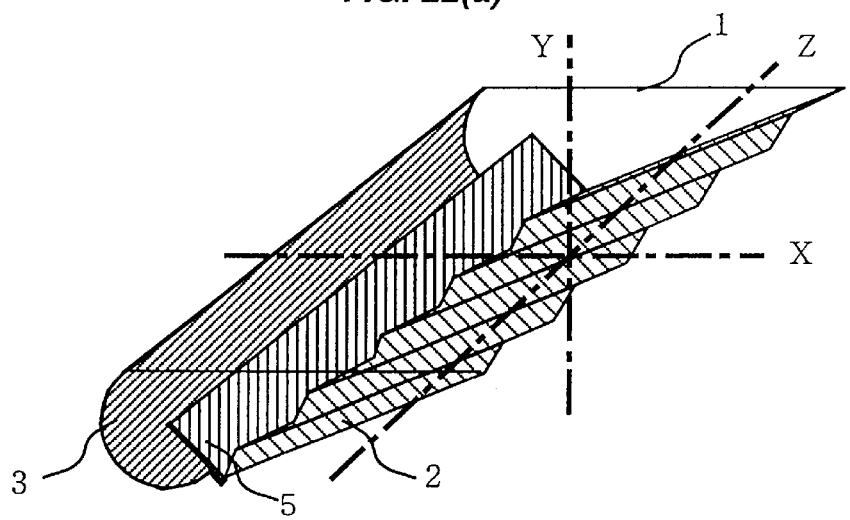
FIG. 22(a) is a view showing the three-dimensional structure of a reflection plane, of a concentrator photovoltaic device, improved for enhancing a light trapping efficiency.
Figure 22B:
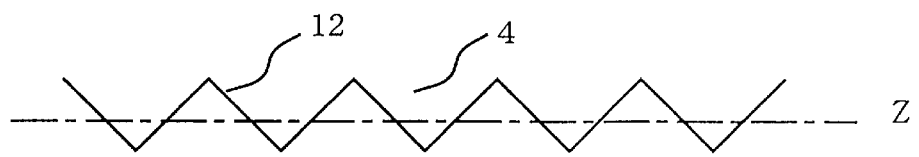
FIGS. 22(b) and 22(c) are diagrams showing the groove structure of the reflection plane shown in FIG. 22(a)
Figure 22C:
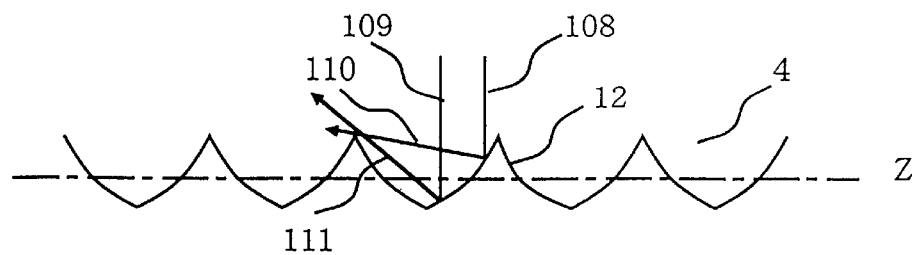

FIG. 21 is a view three-dimensionally showing the above-described structure, for example, the structure shown in each of FIGS. 14(a) to 14(d). In the following description, the direction perpendicular to a light-incident plane 1 is referred to as "Y-direction"; the direction in which a reflection plane 2 crosses the light-incident plane 1 is referred to as "Z-direction"; and the direction perpendicular to these Y-direction and Z-direction is referred to as "X-direction". FIG. 22(a) shows a three-dimensional structure of the reflection plane 2 of the above-described structure, which plane is modified to further enhance the light trapping efficiency; and FIGS. 22(b) and 22(c) are diagrams each showing a groove structure formed in the reflection plane 2. As shown in these figures, the reflection plane 2 has grooves extending along the X-direction. In this way, the reflection plane 2 having the shape which forms a straight line in X-Y cross-section and which forms a groove structure in Z-Y cross-section reflects light obliquely, thereby increasing the incident angle of light when the light having been reflected from the reflection plane 2 is made incident on the light-incident plane 1 again. Consequently, the light which is escaped to the outside in the case of the structure with no groove structure can be subjected to total reflection from the light-incident plane 1, so that a large amount of light can be confined in the concentrator, thereby increasing the possibility of arrival of the light at the photo detector 5, that is, increasing the light trapping efficiency. The cross-sectional shape of the grooves may be curved waves, for example, sine-curved waves; however, in this case, the above effect becomes small because at a portion parallel to or nearly parallel to the Z-axis, an angle between light incident on the portion from the upper side and the light reflected from the portion becomes small. For this reason, it may be desirable that the grooves be formed into shapes in cross-section with no portion parallel to the Z-axis, for example, triangular wavers as shown in FIG. 22(b). Further, the grooves may be formed into shapes shown in FIG. 22(c), in which the slope of each groove is curved and the vertex of the groove is sharpened. In each of the grooves shown in FIG. 22(c), first incident light 108 incident on the slope at a position on the medium 4 side, that is, near the upper side of the figure is reflected at a large angle, while second incident light 109 incident on the slope at a position near the bottom is reflected at a small angle, so that even if an average tilt angle of the slope is made large, the light reflected from one-side slope of the groove is prevented from being impinged on the other-side slope of the groove. In particular, it may be desirable that the cross-sectional shape 12 of the groove of the reflection plane in the Z-Y direction be composed of a curved shape projecting opposite to the medium 4, that is, downwardly in the figure. These grooves are preferably formed in the X-direction; however, they may be tilted somewhat from the X-direction. Even in this case, the same effect can be obtained. The above curved shapes of the grooves may be approximated by a plurality of planes or may be replaced with a combination of curved portions and plane portions.

Figure 23A:
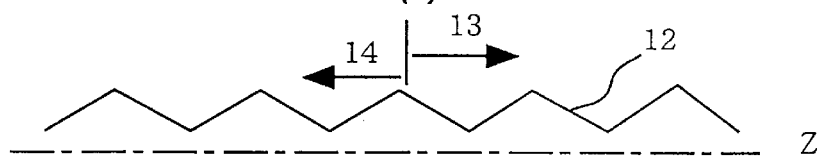
FIGS. 23(a) to 23(c) are diagrams each showing the groove structure of the reflection plane, shown in FIGS. 22(a) to 22(c) in which the shape of the grooves is modified.
Figure 23B:
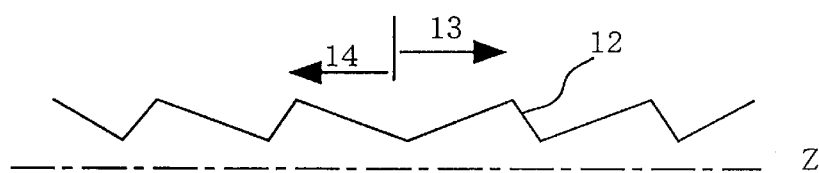
Figure 23C:
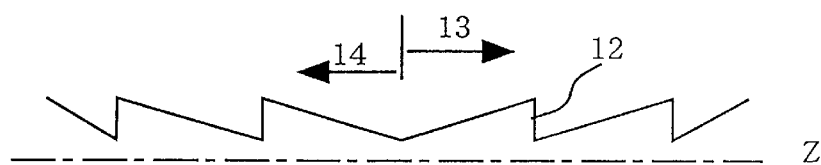

FIGS. 23(a) to 23(c) show modifications of the above grooves of the reflection plane. In the structure shown in FIG. 23(a), the sectional shape 12 of the grooves is designed such that the portions on the right side 13 and left side 14 with respect to an arbitrary point have the same shape. On the contrary, in the structure shown in each of FIGS. 23(b) and 23(c), the sectional shape 12 of the grooves is designed such that the portion on the right side 13 is symmetric to the portion on the left side 14; however, on each of the right and left sides 13 and 14, the shape of a specific one of the grooves is different from that of the adjacent one. By applying this design of the grooves to the concentrator, for example, shown in FIG. 22(a), light can be concentrated at a specific position of the photo detector 5. The distribution of light concentrated on the photo detector 5, obtained by applying the above design of the grooves, is effective to enhance the photoelectric transfer efficiency, for example, by arranging electrodes at portions of the photo detectors, on which portions light is weakly made incident.

Figure 24A:
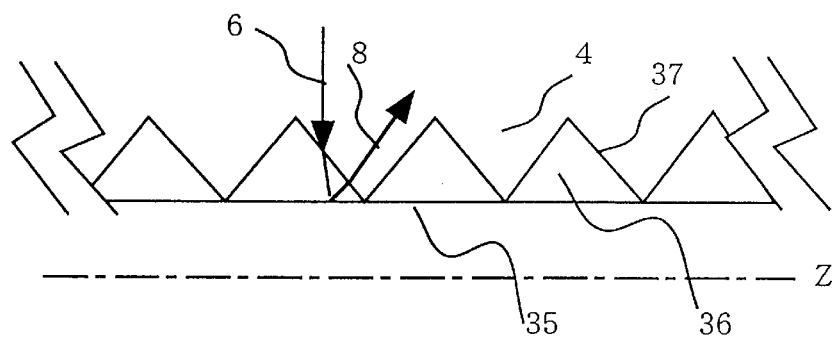
FIGS. 24(a) and 24(b) are diagrams each showing another groove structure of the reflection plane, in which a second medium is buried in the grooves formed in the first medium on the reflection plane side.
Figure 24B:
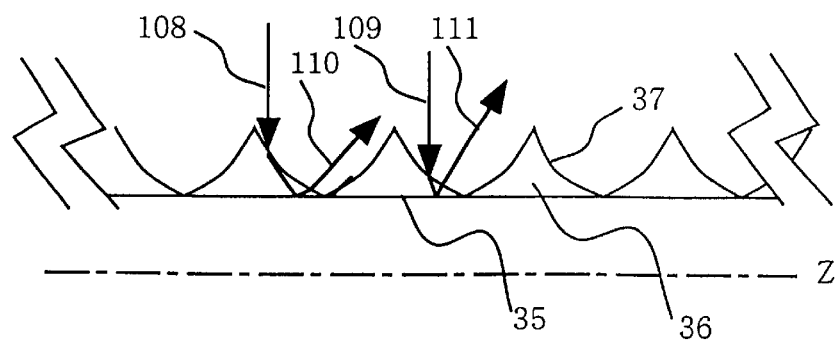

As described above, the light trapping efficiency can be enhanced by forming the groove structure in the reflection plane; however, in this case, it is required to form a large number of grooves in the reflection plane. On the contrary, the structure shown in each of FIGS. 24(a) and 24(b) exhibits the same effect using, as the grooves, a groove-like interface between two media having different refractive indexes. As shown in FIG. 24(a), the shape of the end portion, on the reflection plane 35 side, of the cross-section of a medium 4 is taken as a groove structure which is then buried with a second medium 36 having a refractive index different from that of the first medium 4, and the flat reflection plane 35 is formed on the back side of the second medium 36. This is effective to enhance the light trapping efficiency. When light 6 is made incident on the above groove structure, it is refracted from the interface 37 between the first medium 4 and the second medium 36, being reflected from the reflection plane 35, and is refracted from the interface 37 again. The final light is tilted from the light having been made initially incident on the interface 37. This means that the groove structure shown in FIG. 24(a) exhibits the same function as that of the reflection plane having the groove structure shown in FIGS. 22(a) to 22(c). The refractive index of the second medium 36 may be larger or smaller than that of the first medium 4 insofar as it is different from the refractive index of the first medium 4. However, from the viewpoint of enhancing the light trapping efficiency, it is desirable to make the refractive index of the second medium 36 smaller than that of the first medium 4. In this case, the refractive index of the second medium 36 may become equal to or smaller than that of the environment outside the light-incident plane. Also as an angle formed between the light incident on the interface 37 from the medium 4 side and the reflection plane 35 becomes smaller, the incident light 6 is, although the second medium 36 is provided, reflected into the medium 4 at the same angle as that given in the case where the second medium 36 is not provided and only the reflection plane 35 exists. As a result, the light trapping efficiency can be made higher than that obtained by the structure having the groove-like reflection plane shown in FIGS. 22(a) to 22(c). The shape of the interface 37 may be composed of a combination of curved planes as shown in FIG. 24(b). While the above description is made by example of the structure in which the first and second media 4 and 36 located on both the sides of the interface have the different refractive indexes, a region in which the refractive indexes of the first and second media 4 and 36 are continuously changed may exist at the interface and its neighborhood. In this case, same effect of the present invention can be also obtained.

In the above description, the shape of each part of the concentrator is specified using the straight line, curved line, circular-arc, plane, or curved plane shape, it may be considered that the above-specified shape of each part of the concentrator causes irregularities or distortion within an allowable error range due to a manufacturing error upon actual manufacture of the concentrator. Also, it may be considered that the shape of each part of the concentrator may be changed, for example, a sharpened portion of the above structure may be rounded in accordance with a requirement from the viewpoint of the manufacturing technique. However, as long as a main part of the concentrator is substantially formed into the above-described shape, the above-described effect can be of course obtained.

Figure 25A:
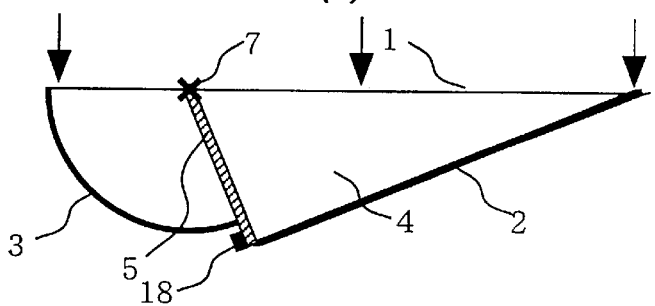
FIGS. 25(a) and 25(b) are sectional views each showing the configuration of a concentrator photovoltaic device of the present invention, in which an electrode is provided on a portion, positioned outside a concentrator, of a photo detector.
Figure 25B:
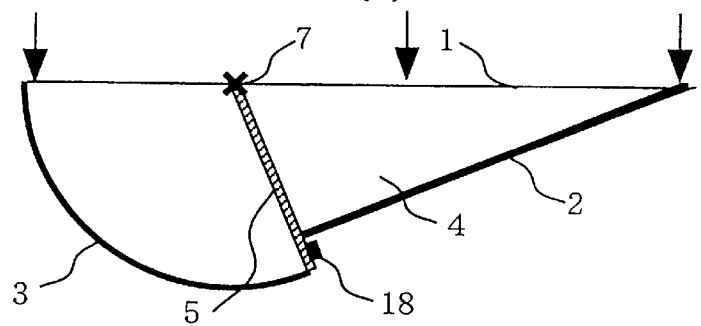
Figure 26A:
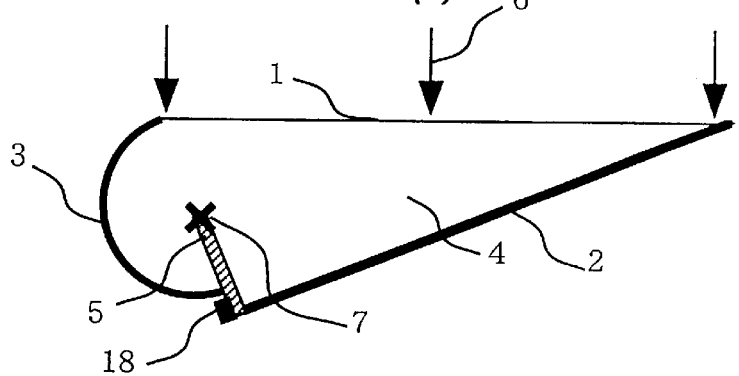
FIGS. 26(a) and 26(b) are sectional views each showing the configuration of a concentrator photovoltaic device of the present invention, in which an electrode is provided on a portion, positioned outside a concentrator, of a photo detector.
Figure 26B:
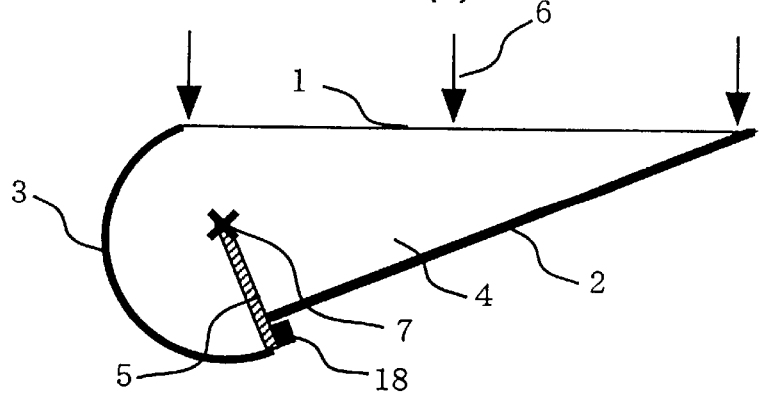

A photovoltaic device of the present invention, having the structure in which power generated from a photo detector 5 is outputted from an electrode 18 without reducing the light trapping efficiency, will be described with reference to FIGS. 25(a) and 25(b). In the structure shown in FIG. 25(a), the radius of a circular-arc reflection plane is smaller than the length of the photo detector 5 extending from the center of the circular-arc of the circular-arc reflection plane to the end point, on the photo detector 5 side, of a reflection plane 2. Meanwhile, in the structure shown in FIG. 25(b), the radius of the circular-arc reflection plane is larger than the above length of the photo detector 5. With this structure, it is possible to form the electrode 18 on a portion, positioned outside the concentrator, of the photo detector 5 or a part continuous thereto, and hence to eliminate the reduction in light trapping efficiency due to shadowing by the electrode 18 formed on the photo detector 5 positioned in the concentrator, that is, the shadow loss. The photovoltaic device shown in each of FIGS. 26(a) and 26(b) exhibits the same effect.

Figure 27A:
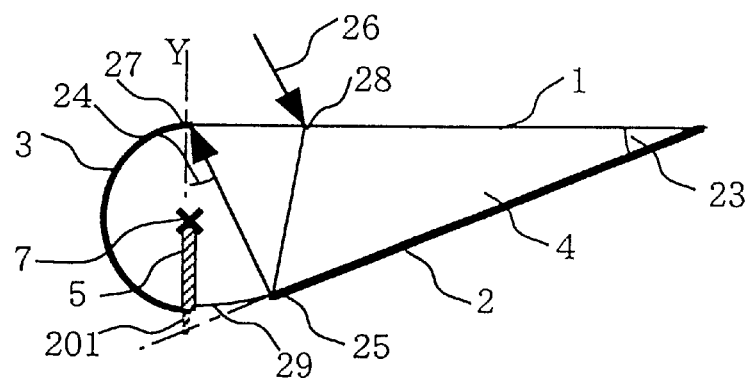
FIGS. 27(a) and 27(b) are sectional views each showing the configuration of a concentrator photovoltaic device of the present invention, in which the linear reflection plane and the circular-arc reflection plane shown in FIGS. 13(a) and 13(b) are modified.
Figure 27B:
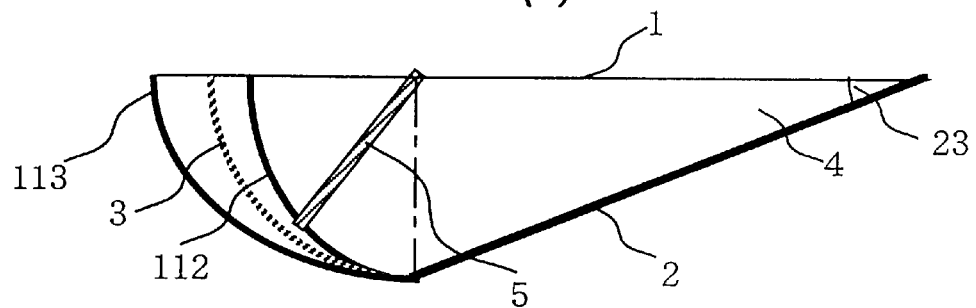

A photovoltaic device of the present invention, in which the linear reflection plane 2 and circular-arc reflection plane 3 of the structure, for example, described with reference to FIGS. 13(a) and 13(b) are modified, will be described with reference to FIGS. 27(a) and 27(b). The light trapping efficiency of the concentrator shown in FIGS. 13(a) and 13(b) is largely dependent on an angle 23 formed between the light-incident plane 1 and linear reflection plane 2. As the angle 23 becomes larger, the light trapping efficiency is enhanced; however, the concentrating ratio is reduced. In this regard, it may be desirable to make the angle 23 as small as possible within a range in which the light trapping efficiency is not reduced so much. In the case where the refractive index of the medium 4 is 1.5, the angle 23 is preferably set at about 22°. However, it may be considered that the angle 23 may be made smaller for the increasing the concentrating ratio or made larger for increasing the light trapping efficiency in accordance with the application. With the angle 23 kept constant, the concentrating ratio can be increased without reducing the light trapping efficiency by forming part, on the circular-arc reflection plane 3 side, of the linear reflection plane 2 into a kinked line or curved line. In the structure shown in FIG. 27(a) in which the linear reflection plane 2 is modified, only a portion 29 between a point 25 of the linear reflection plane 2 and the circular-arc reflection plane is formed into a shape such as a parabolic curved line or a kinked line similar thereto. Here, the point 25 is defined such that of incident light desired to be introduced to a photo detector 5 shown in FIG. 27(a), light 26 most tilted on the circular-arc reflection plane 3 side is reflected from the linear reflection plane 2 at the point 25 and is made incident on an end point 27, on the circular-arc reflection plane 3 side, of a light-incident plane 1. With this configuration, it is possible to improve the concentrating ratio without reducing the light trapping efficiency, although the size of the circular-arc reflection plane 3 is made small by a value equivalent to a straight line 201 connecting the intersection between the extension of the photo detector 5 and the extension of the linear reflection plane 2 to the intersection between the photo detector 5 and the circular-arc reflection plane 3. The structure in which the circular-arc reflection plane 3 is modified will be described in FIG. 27(b). If an angle formed between each of two straight lines, which connect a portion, most remote from the circular-arc reflection plane 3, of the photo detector 5 to both the ends of the circular-arc reflection plane 3, and incident light crossing the straight line is distributed in a range of 0 to 180°, all the incident light cannot be introduced in the photo detector 5 unless the circular-arc reflection plane 3 is formed into a perfect circular-arc. The angle formed between the incident light and the straight line, however, is actually not distributed in the range of 0 to 180°. Accordingly, the area of the photo detector 5 can be reduced with the light trapping efficiency little lowered even if the shape of the circular-arc reflection plane 3 is changed into a curved line 112 having a large curvature or a curved line 113 having a small curvature. Each of the curved lines 112 and 113 may be replaced with a kinked line similar thereto. The above effect can be obtained for the photovoltaic device with a cover glass portion.

Figure 28:
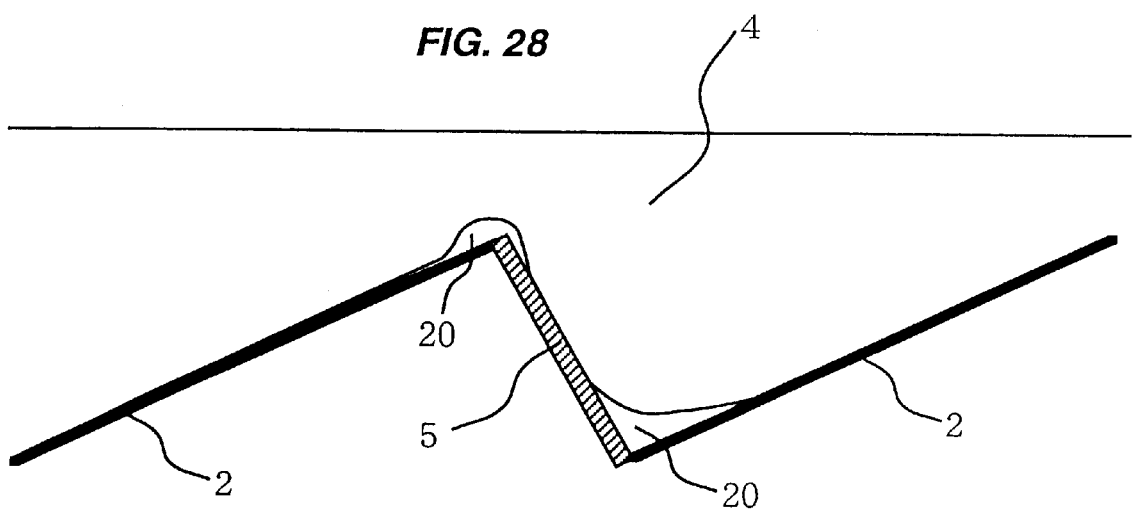
FIG. 28 is a sectional view showing a concentrator photovoltaic device in which a rounded or chipped shapened portion of a medium is buried with a second medium.

In the structures described above, there may sometimes occur an inconvenience in which a sharpened portion of the medium 4 becomes round or chipped on the basis of some manufacturing reason as shown in FIG. 28. In this case, by burying such a portion with a second medium 20, it is possible to obtain the same light trapping efficiency as that for the case in which the medium 4 has no defect in shape.

Figure 29A:
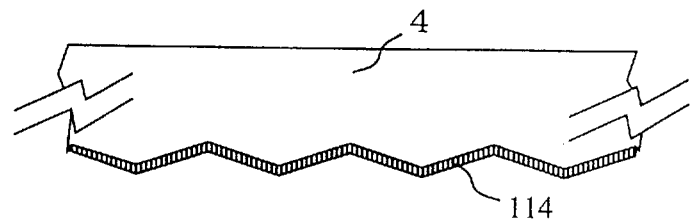
FIGS. 29(a) to 29(e) are sectional views each showing the concrete structure of a reflection plane of a concentrator of a concentrator photovoltaic device of the present invention.
Figure 29B:
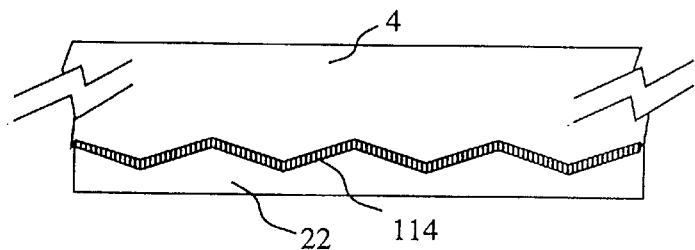
Figure 29C:
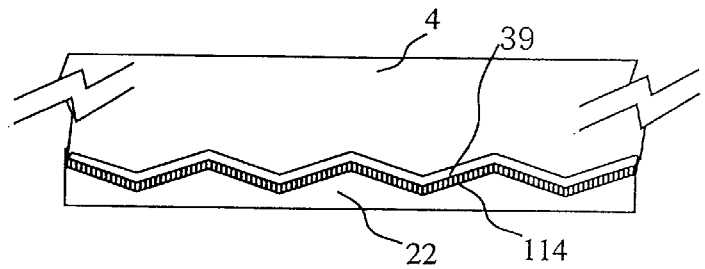
Figure 29D:
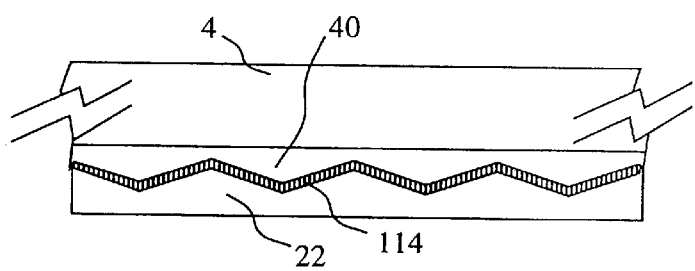
Figure 29E:
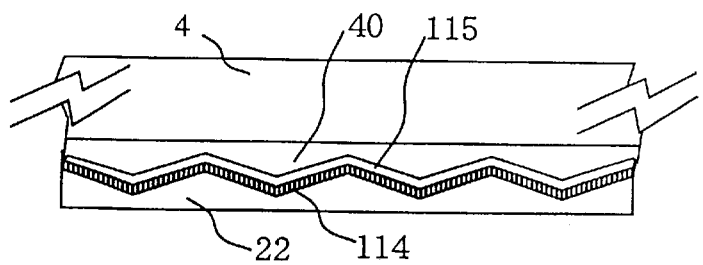

As the concrete structure of the reflection plane of the above concentrator, there may be considered a structure shown in FIG. 29(a) in which a reflection material layer 114 is formed on the surface of the medium 4 by vapor-deposition of a metal. In such a structure, as shown in FIG. 29(b), a lamination layer 22 made from a resin can be formed on the back face of the reflection material layer 114 for protecting the reflection material layer 114 and medium 4, and further protecting the photo detector and electric wiring. Since the lamination layer 22 is provided opposite to the medium 4 with respect to the reflection material layer 114, incident light does not pass through the lamination layer 22, and accordingly, the lamination layer 22 is not necessarily made from a transparent material. Also, as shown in FIG. 29(c), the reflection plane can be simply formed by preparing the lamination layer 22 formed of a soft material sheet, for example, a plastic sheet, forming the reflection material layer 114 on the surface of the lamination layer 22, and bonding the reflection material layer 114 to the medium 4 with an adhesive layer 39. In the structure shown in FIG. 29(d), the reflection material layer 114 is sandwiched between a sheet layer 40 and the lamination layer 22. This structure is advantageous in using the medium 4 having the flat underside. Further, as shown in FIG. 29(e), an interference thin film 115 composed of a single layer or multiple layers having a refractive index smaller than that of the medium 4 may be provided on the surface, on the inner side of the concentrator, of the reflection plane. This is effective to enhance the reflectance of the reflection plane. In this case, by suitably combining the refractive index and thickness of the interference thin film 115 with each other, the reflectance of light in a specific wavelength range reflected from the reflection plane can be strengthened or weakened. The concentrator including the interference thin film 115 exhibits a specific color when it is viewed from the outside. In addition, the reflectance of light in a specific wavelength range reflected from the reflection plane can be strengthened or weakened without use of the interference thin film 115 by suitably selecting the material of the reflection material layer 114. The reflection material layer 114 may be made from silver or aluminum. In this case, it is possible to form a reflection plane having a high reflectance against the wavelength of sunlight. As described above, various structures of the reflection plane can be adopted, and the actual structure of the reflection plane may be a combination of these structures, which may be further combined with an adhesive layer as needed. The refractive index of the adhesive is preferably close to that of the medium; however, if the thickness of the adhesive layer is small, the refractive index of the adhesive may be different from that of the medium.

The present invention will be more clearly understood with reference to the following embodiments:

Embodiment 1

Figure 30A:
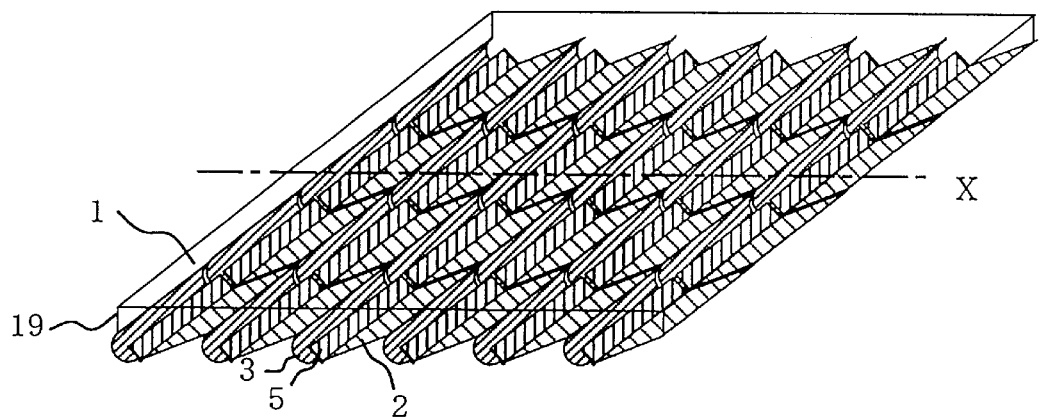
FIGS. 30(a) and 30(b) are views showing the structure of a concentrator photovoltaic module including concentrator photovoltaic devices according to a first embodiment of the present invention.
Figure 30B:
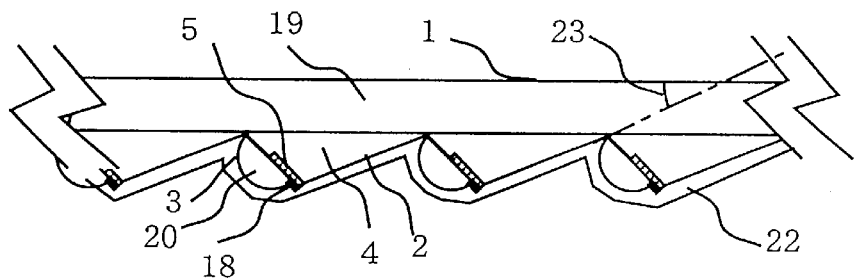

FIG. 30(a) shows the structure of a concentrator photovoltaic module including concentrator photovoltaic devices according to a first embodiment of the present invention, and FIG. 30(b) shows the cross-section of the structure in the X-direction shown in FIG. 30(a). The basic structure of the module is the same as the concentrating structure shown in FIGS. 13(a) and 13(b). First, medium 4, each having a triangular shape in cross-section and being made from an acrylic resin, were bonded by means of ethylene-vinyl acetate copolymer (EVA) on a cover glass sheet 19 formed of a tempered glass having a thickness of 3 mm. Photo detectors 5, each being configured as a bifacial solar cell made from a crystalline silicon semiconductor, were bonded on the medium 4 by means of EVA. To position an electrode 18 provided on each solar cell outside a concentrating reflection plane, the radius of a circular-arc reflection plane 3 is made smaller than the length of the photo detector 5. Each second medium 20 having the circular-arc reflection plane 3 was formed by vapor-depositing silver in vacuum on the surface of a fan shaped acrylic resin. The second medium 20 were bonded on the medium 4 and the photo detectors 5 by means of EVA, and the medium 4, photo detectors 5, electrodes 18, and circular-arc reflection planes 3 were covered with a sheet 22 serving as a lamination sheet. The sheet 22 has a reflection plane which is made from silver and has a groove structure along the X-direction as shown in FIG. 29(d). The bonding of the sheet 22 was performed using EVA. The thickness of the concentrator including the cover glass sheet was set at 6 mm. An angle 23 formed between the reflection plane 2 and a light-incident plane 1 was set at 25°. The electrodes 18 are alternated in positive and negative sides in the vertical direction from the front to the back of the drawing. The electrodes 18 of a pair of the adjacent solar cells are connected in parallel to each other, and then connected to the electrodes of another pair of the solar cells in series to each other. With this structure, the concentrating ratio was 4.2, and the light trapping efficiency of sunlight was 84% (including a loss caused at the light-incident planes 1 having a reflectance of about 4% and a loss caused at the silver reflection planes having a reflectance of about 95%).

The above description is made by example of the structure in which the angle formed in the reflection plane 2 and the light-incident plane 1 is set at 25°, such an angle is determined in consideration of a relationship between the light trapping efficiency and the concentrating ratio. To make higher the concentrating ratio, the angle may be made smaller. For example, the concentrating ratio can be enhanced to about 7.5 by making small the angle to about 15°. In this case, however, the light trapping efficiency is reduced to about 65%. If the angle is made small to a value less than 15°, the light trapping efficiency is rapidly reduced. Meanwhile, in the case where the concentrating ratio is not required to be increased so much, the angle formed between the reflection plane 2 and the light-incident plane 1 may be made large to about 35°. In this case, the concentrating ratio is held at about 2.8, and the light trapping efficiency can be increased to about 94%. If the angle is set at 45°, the concentrating ratio becomes about 2, which is nearly equal to that of a bifacial photo detector with no concentrating structure. This means that the concentrating effect is substantially lost. Accordingly, the angle is required to be in a range of less than 45°.

Embodiment 2

Figure 31A:
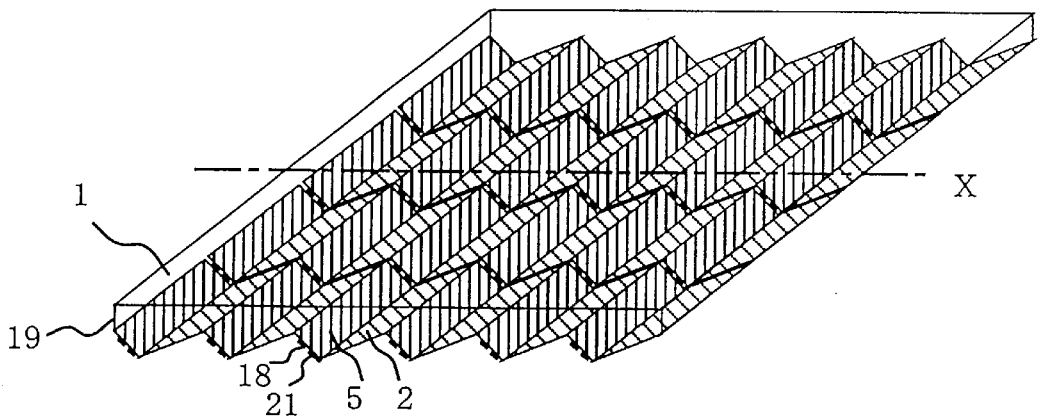
FIGS. 31(a) and 31(b) are views showing the structure of a concentrator photovoltaic module including concentrator photovoltaic devices according to a second embodiment of the present invention.
Figure 31B:
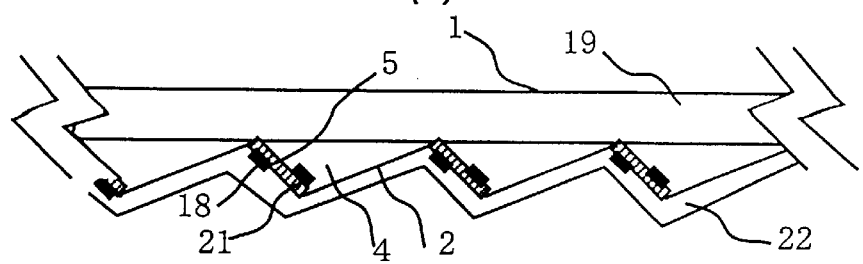

FIGS. 31(a) and 31(b) show the structure of a concentrator photovoltaic module including concentrator photovoltaic devices according to a second embodiment of the present invention. The basic sectional structure of the module in the X-direction is the same as the structure shown in FIGS. 9(a) to 9(c). The module was prepared in the same manner as that in the first embodiment except that the circular-arc reflection planes were not formed. Further, in this embodiment, the bifacial solar cell in the first embodiment was changed into a unifacial solar cell. This is because in this module, light is made incident on each photo detector 5 only from the medium 4 side. When sunlight is made incident on the photo detector 5, the irradiation intensity on the lower side of the right surface of the photo detector 5 in the figure becomes lower. For this reason, an electrode 21 on the light-incident plane side was provided on the lower side of the photo detector 5, to thereby enhance the light trapping efficiency. An angle formed between the reflection plane 2 and the light-incident plane 1 was set at 22°. With this structure, the concentrating ratio was 2.6, and the light trapping efficiency of sunlight was 87% (including a loss caused at the light-incident planes 1 having a reflectance of about 4% and a loss caused at the silver reflection planes having a reflectance of about 95%).

The above description is made by example of the structure in which the angle formed in the reflection plane 2 and the light-incident plane 1 is set at 22°, such an angle is determined in consideration of a relationship between the light trapping efficiency and the concentrating ratio. To make higher the concentrating ratio, the angle may be made smaller. For example, the concentrating ratio can be enhanced to about 3.8 by making small the angle to about 15°. In this case, however, the light trapping efficiency is reduced to about 68%. If the angle is made small to a value less than 15°, the light trapping efficiency is rapidly reduced. Meanwhile, in the case where the concentrating ratio is not required to be increased so much, the angle formed between the reflection plane 2 and the light-incident plane 1 may be made large to about 35°. In this case, the concentrating ratio is held at about 1.4, and the light trapping efficiency can be increased to about 96%. If the angle is set at 45°, the concentrating ratio becomes about 1. This means that the concentrating effect is lost. Accordingly, the angle is required to be in a range of less than 45°.

Embodiment 3

Figure 32A:
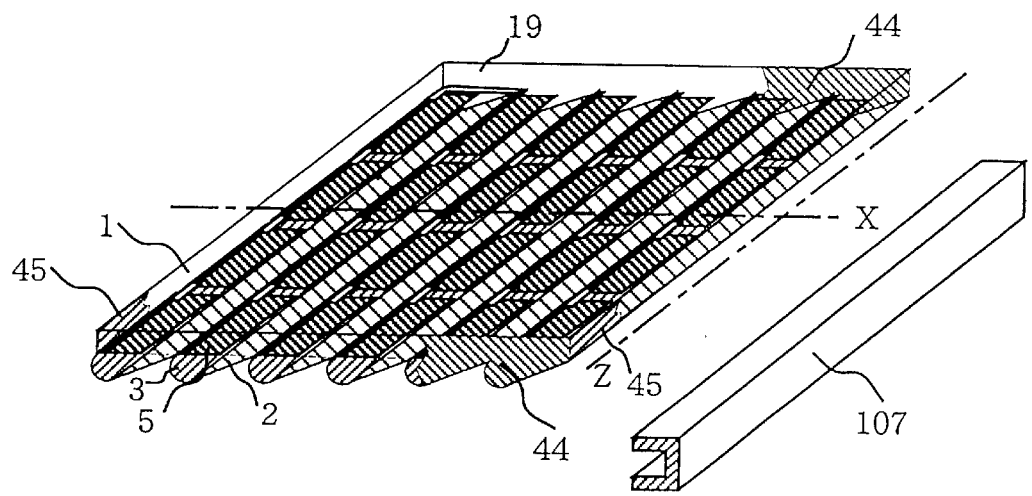
FIGS. 32(a) to 32(c) are views showing the structure of a concentrator photovoltaic module including concentrator photovoltaic devices according to a third embodiment of the present invention.
Figure 32B:
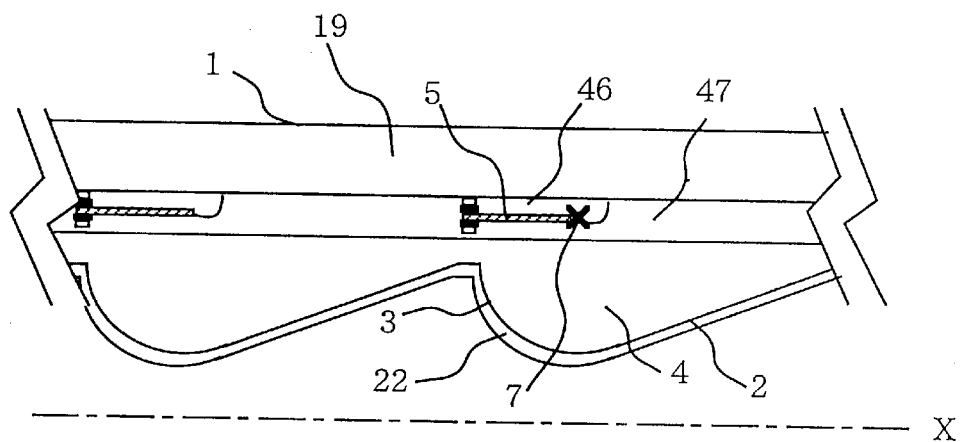
Figure 32C:
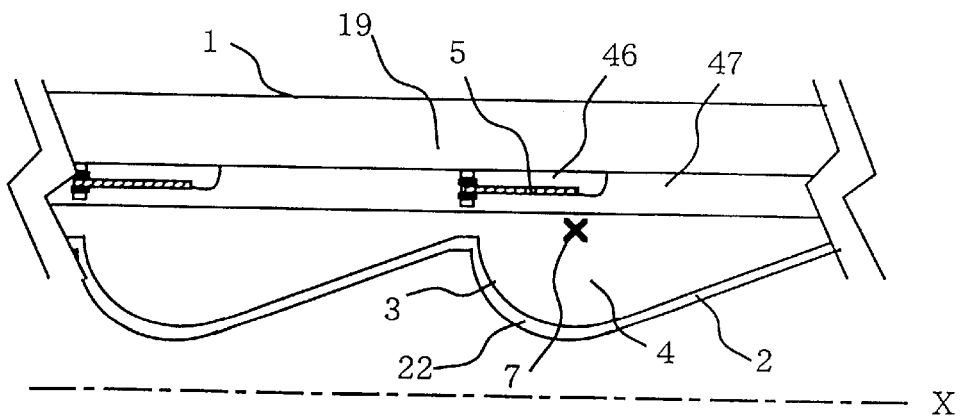

FIGS. 32(a) to 32(c) show the structure of a concentrator photovoltaic module including concentrator photovoltaic devices according to a third embodiment of the present invention. In this embodiment, as shown in FIGS. 32(b) and 32(c), the basic sectional structure of the module in the X-direction is the same as the structure shown in FIG. 8. The module in this embodiment was prepared basically in the same manner as that in the first embodiment. Light reflected from concentrators is made incident on both the side surfaces of the module in the Z-direction and X-direction. To make effective use of such light, the side surfaces of the module were stuck with reflection sheets into reflection planes 44 and 45. The peripheral portion of the module was covered with an aluminum frame 107 to increase the mechanical strength. A photo detector 5 is desirable to be arranged on a line connecting the rotational center 7 of the circular-arc of a circular-arc reflection plane 3 to a point on the circular-arc reflection plane 3. However, to continuously integrate media 4 of the adjacent ones of the concentrators with each other, as shown in FIG. 32(*b*), part of the circular-arc reflection plane 3 on the photo detector 5 side in each concentrator was buried within the medium 4. Further, as shown in FIG. 32(*c*), in each concentrator, the photo detector 5 was offset from the straight line connecting the end of the circular-arc reflection plane 3 and the rotational center 7 thereof onto the light-incident plane 1 side, to thereby continuously integrate the media 4 with each other by molding. In the case where the photo detector 5 is offset from the desired position, the light trapping efficiency is reduced. If the offset of the photo detector 5 from the desired position is set at a value equivalent to one-fifth the radius of the circular-arc reflection plane 3, the light trapping efficiency is reduced by about 5%. If the offset of the photo detector 5 is set at a value equivalent to one-third the radius of the circular-arc reflection plane 3, the light trapping efficiency is reduced by about 10%. Further, if the offset of the photo detector 5 is set at a value more than one-third the radius of the circular-arc reflection plane 3, the light trapping efficiency is rapidly reduced. As a result, the offset of the photo detector 5 from the desired position is preferably set at a value equal to or less than one-third the radius of the circular-arc reflection plane 3.

Embodiment 4

Figure 33A:
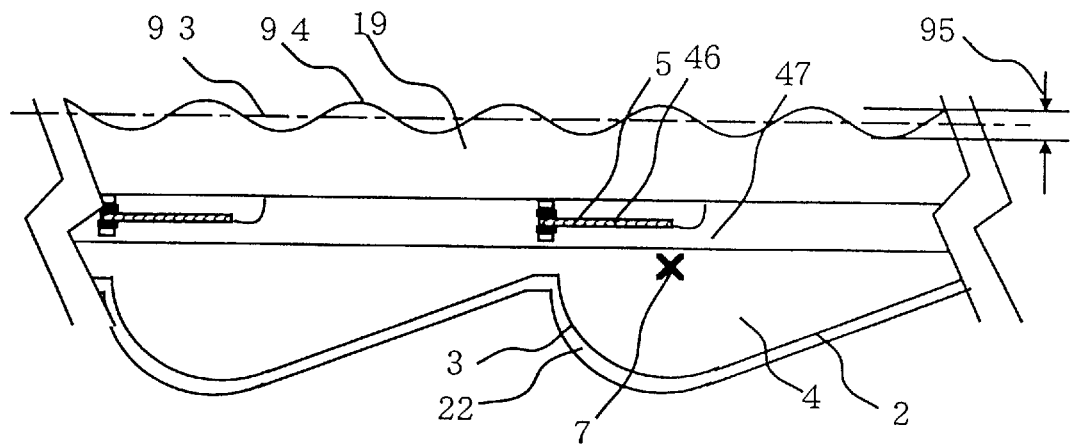
FIGS. 33(a) and 33(b) are views showing the structure of a concentrator photovoltaic module including concentrator photovoltaic devices according to a fourth embodiment of the present invention.
Figure 33B:
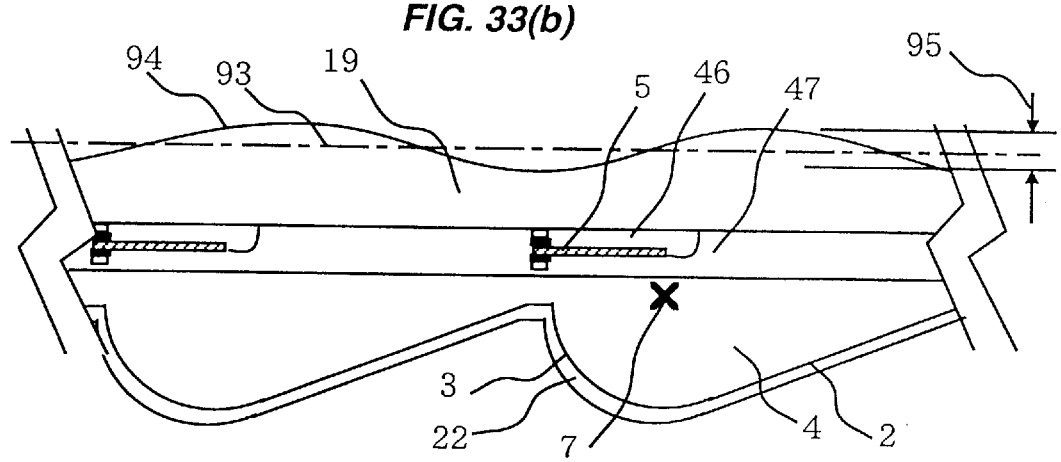

FIGS. 33(*a*) and 33(*b*) show the structure of a concentrator photovoltaic module including concentrator photovoltaic devices according to a fourth embodiment of the present invention. The sectional shape of the light-incident plane of each of the concentrators in the previous embodiments forms the straight line. In order to keep the light trapping efficiency at a high value, the sectional shape of the light-incident plane is desirable to form the straight line. However, if the design characteristics and prevention of adverse effect exerted by reflection take precedence over the power generation efficiency, as shown in FIGS. 33(*a*) and 33(*b*), the light-incident plane may be designed to have two-dimensional or three-dimensional fine irregularities 94. For the module including concentrators each having the light-incident plane having above fine irregularities 94, it is possible to obtain a high light trapping efficiency by designing each concentrator such that a macroscopic plane 93 having the average value of heights of the fine irregularities 94 is taken as the above-described flat light-incident plane of the concentrator. If the height 95 of the fine irregularities 94 is equal to one-fifth the average cycle of the fine irregularities 94, the light trapping efficiency is reduced by about 18%. If the height 95 is more than one-fifth the average cycle of the fine irregularities 94, the light trapping efficiency is rapidly reduced. Meanwhile, to keep the reduction in light trapping efficiency at about 10%, the height 95 is desirable to be equal to or less than one-tenth the average cycle of the fine irregularities 94. The light trapping efficiency is substantially not dependent on whether the cycle of the finely irregular structure is short (see FIG. 33(*a*)) or long (see FIG. 33(*b*)). In this embodiment, to reduce the adverse effect exerted by reflection, the fine irregularities having a sine-curve cross-section (cycle: 10 mm, height: 0.2 mm) shown in FIG. 33(*b*) is applied to the basic structure shown in FIG. 32(*c*). In this case, the reduction in light trapping efficiency is suppressed at 3%.

Embodiment 5

Figure 34:
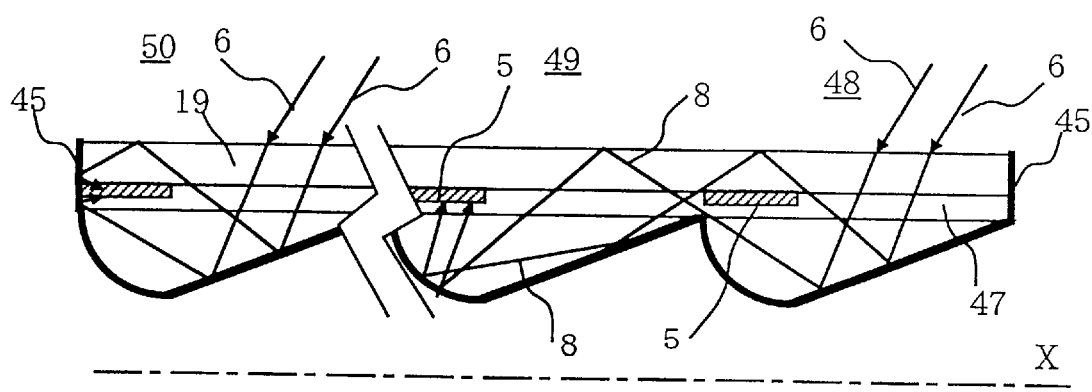
FIG. 34 is a sectional view showing the configuration of a concentrator photovoltaic module according to a fifth embodiment of the present invention.

FIG. 34 shows the sectional structure of a concentrator photovoltaic module according to a fifth embodiment of the present invention. In this structure, part of light 6, which has been made incident on the rightmost concentrator 48 obliquely in the X-direction of the figure from the right, upper side, travels in the concentrator 48 and then enters the adjacent concentrator 49. Accordingly, the quantity of light incident on a photo detector 5 provided in the rightmost concentrator 48 is smaller than that of light incident on the photo detector 5 provided in the adjacent concentrator 49. With respect to each concentrator put between the concentrators located at both the ends of the module, part of light having been incident on the light-incident plane of the concentrator enters one of the adjacent concentrators; however, part of light enters the concentrator from the other of the adjacent concentrators. Accordingly, the variation in quantity of incident light incident on the photo detector little occurs between these intermediate concentrators. Also, light being made incident on the photo detector 5 provided in the leftmost concentrator 50 is reflected from a reflection mirror 45 provided at the end surface of the module and is made incident on the photo detector 5 provided in the concentrator 50; and part of light having been made incident on the adjacent right concentrator enters the photo detector 5 provided in the concentrator 50. As a result, the quantity of the light incident on the photo detector 5 provided in the concentrator 50 is larger than that of light incident on the photo detector 5 provided in any one of the other concentrators. For this reason, it may be undesirable to connect the output of the photo detector provided in the rightmost concentrator or the leftmost concentrator in series or parallel to the outputs of the photo detectors provided in the other concentrators. As the measure for this, it may be considered that the size of the rightmost or leftmost concentrator is changed or a light shielding portion is provided therein depending on an increase or decrease in current of the rightmost or leftmost concentrator in order to match the quantity of incident light at the rightmost or leftmost concentrator with that at another intermediate concentrator. In this method, however, it is difficult to design the optimum structure in consideration of a change in incident angle of incident light. On the other hand, by connecting the outputs of the photo detectors provided in the rightmost and leftmost concentrators in parallel to each other, the outputs of the photo detectors provided in the rightmost and leftmost concentrators become nearly twice the output of the photo detector in another intermediate concentrator even if the incident angle of incident light is varied. As a result, the energy of the incident light can be effectively used by connecting, in series or in parallel, the outputs of the rightmost and leftmost concentrators connected in parallel to each other to the outputs of the photo detectors of the other concentrators. In this embodiment, the structure shown in FIG. 32(*c*) is used as a basic structure, and as shown in FIG. 34, the outputs of the photo detectors 5 provided in the rightmost concentrator 48 and the leftmost concentrator 50 are connected in parallel to each other, and are connected in parallel to the outputs of a plurality of photoelectric transducers 5 provided in the other concentrators 49 which are connected in parallel to each other. Then, a collection of the photo detectors in parallel to each other are connected in series to each other.

Embodiment 6

Figure 35:
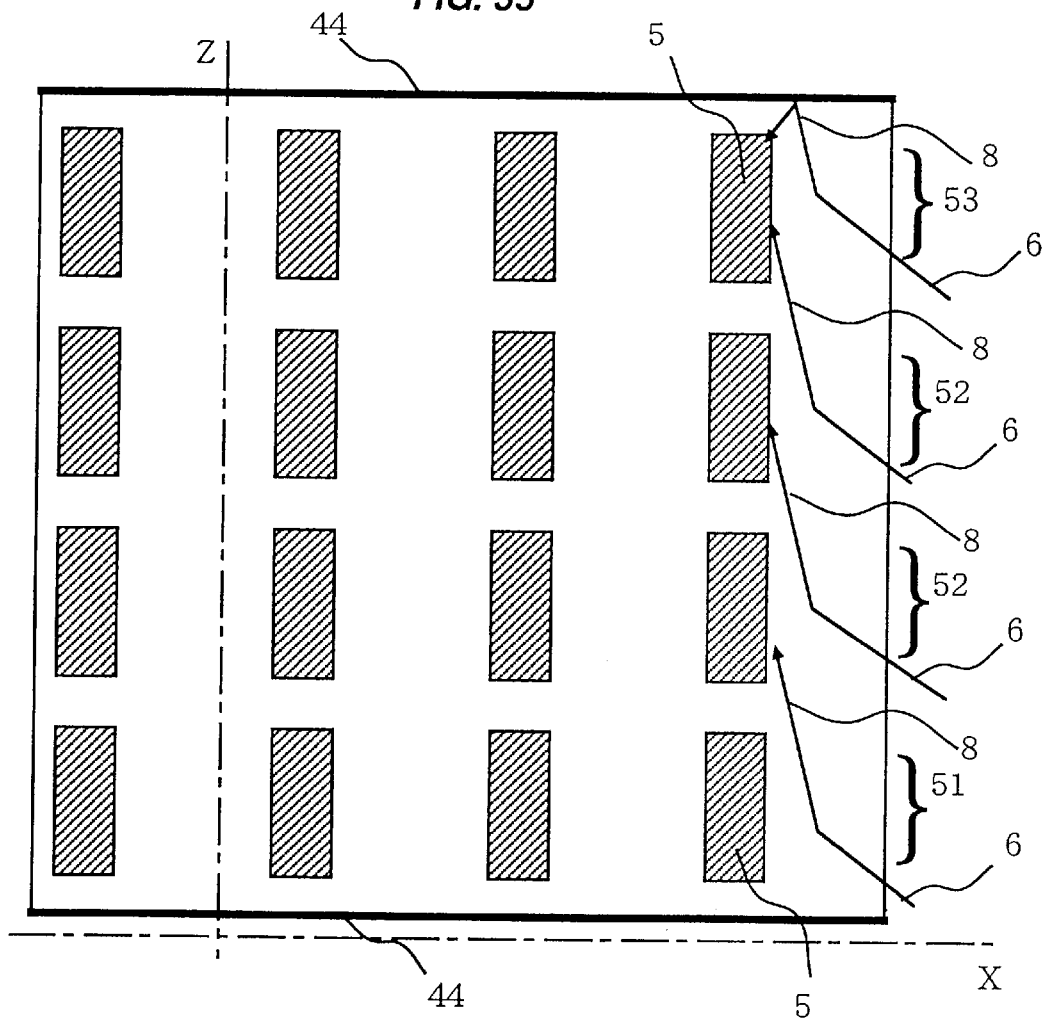
FIG. 35 is a top view showing the configuration of a concentrator photovoltaic module according to a sixth embodiment of the present invention.

FIG. 35 is a top view showing the structure of a concentrator photovoltaic module according to a sixth embodiment of the present invention. The structure of this embodiment is the same as that of the fifth embodiment except that while the incident light is tilted in the X-direction in the fifth embodiment, the incident light is tilted in the Z-direction of FIG. 35 in this embodiment. When light 6 coming from the lower side of FIG. 35 is made incident on the incident-plane of a concentrator 51, part of the light 6 enters the adjacent concentrator 52 and is then made incident on a photo detector 5 provided in the concentrator 52. Accordingly, in this module, by connecting the output of the photo detector provided in the lowermost concentrator 51 in parallel to the output of the photo detector provided in the uppermost concentrator 53 and connecting the above outputs in parallel or series to the outputs of the photo detectors provided in the other concentrators, it is possible to achieve the optimum wiring for effectively utilizing the energy of the incident light. In this embodiment, which basically adopts the structure shown in FIG. 31(b), as shown in FIG. 35, the output of the photo detector 5 provided in the lowermost concentrator 51 is connected in parallel to the output of the photo detector 5 provided in the uppermost concentrator 53, and these outputs are connected in series to the outputs of the photo detectors 5 provided in the other concentrators 52 which are connected in parallel to each other. If the reflection plane of such a connector has the groove structure extending in the X-direction, reversely to the above description, the light 6 coming from the lower side of the figure into the concentrator 51 is reflected downwardly from the reflection plane 2 of the concentrator 51, and is reflected from the side surface of the module. Part of the light reflected from the side surface is made incident on the photo detector of the concentrator 51. Meanwhile, part of the light reflected from the side surface is made incident on the concentrator 53 and is then made incident on the adjacent concentrator 52. Even in this case, like the case described above, by connecting the output of the photo detector 5 provided in the uppermost concentrator in parallel to the output of the photo detector 5 provided in the lowermost concentrator, it is possible to achieve the optimum wiring for effectively utilizing the energy of the incident light.

Embodiment 7

Figure 36:
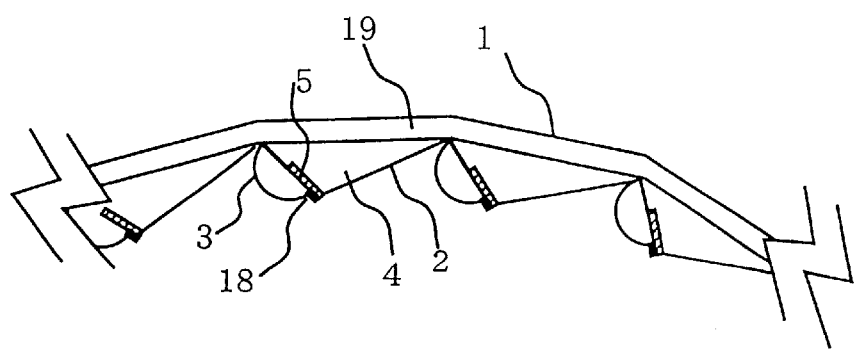
FIG. 36 is a sectional view showing the configuration of a concentrator photovoltaic module according to a seventh embodiment of the present invention.

FIG. 36 shows the sectional structure of a concentrator photovoltaic module according to a seventh embodiment of the present invention. As shown in this figure, by folding or curving each portion for continuously connecting the adjacent two pieces of concentrators to each other, there can be obtained a polygonal module whose cross-section is curved without changing the light trapping efficiency of each concentrator. If a change in light trapping efficiency is somewhat allowable, a polygonal or curved module can be obtained by forming all the components of the module or at least a cover glass portion 19 into a polygonal or curved shape in cross-section. In this case, the shape of each of the light-incident plane 1 and reflection plane 2 of the concentrator is offset from the optimum shape; however, if the reduction in light trapping efficiency due to the offset of the shape is within an allowable range, it is rather effective to satisfy the requirement in terms of the shape of the module establishing location and also improve the design characteristic. In this embodiment, to establish the module along the curved roof, there is used a cover glass sheet 19 having the structure in which each portion between the adjacent two pieces of the concentrators is folded. The module may be also configured such that the adjacent two pieces of the concentrators are separated from each other and at least the cover glass portion located between the adjacent concentrators is made from a flexible plastic sheet or metal sheet. This is effective to wind the module in a roll shape and then store it in a compact shape upon no service. The module may be further configured such that a plurality of concentrators are arranged on a metal sheet. This is effective to freely bend or wind such a module. For example, the module capable of being wound in a roll shape is obtained by arranging concentrators each having a width of 1 cm and a thickness of 6 mm on a cover glass portion having a thickness of 1 mm. The module having such a structure can be wound in a roll shape having the minimum radius of about 10 cm.

Embodiment 8

Figure 37:
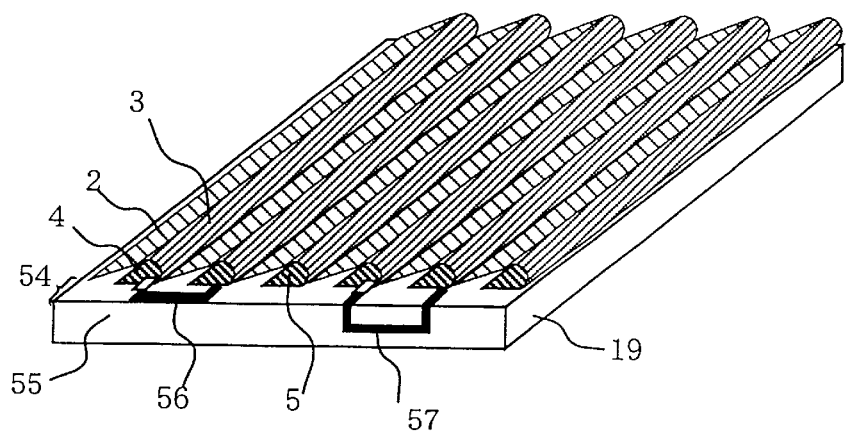
FIG. 37 is a perspective view showing the configuration of a concentrator photovoltaic module according to an eighth embodiment of the present invention.

FIG. 37 is a perspective view, seen from the reflection plane 2 side, of a concentrator photovoltaic module for illustrating a method of carrying out electric wiring between concentrators according to an eighth embodiment of the present invention. As shown in this figure, if there remain a cover glass surface 54 and a side surface 55 on which there are not present a linear reflection plane 2, circular-arc reflection plane 3, photo detector 5, and medium 4 filling a space surrounded by the reflection planes 2 and 3 and the photo detector 5, wiring may be formed in contact with these surfaces 54 and 55. This is effective to make wiring more rigid as compared with the case of air wiring. Also, by forming a wiring at a space between the medium 4 and the cover glass sheet 19 or on the surfaces thereof, it is possible to make wiring more rigid as compared with air wiring, for example, at the outside of the reflection plane 2. In this embodiment, each wiring between the photo detectors in one row is arranged between the medium 4 and the cover glass sheet 19. This makes it possible not only to obtain a rigid wiring but also to automatically isolate the wiring from the outside of the concentrator. A wiring 56 between adjacent rows is formed on the cover glass surface 54. In the above description, an adhesive layer is of course present between these wirings and the cover glass surface.

Embodiment 9

Figure 38A:
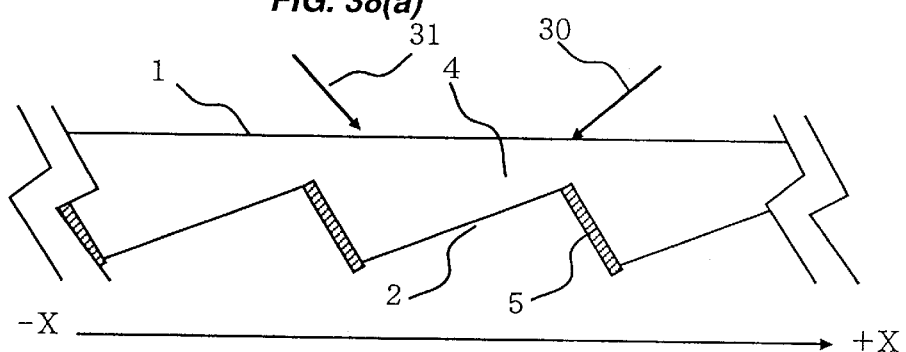
FIGS. 38(a) to 38(c) are views showing the configuration of a concentrator photovoltaic module according to a ninth embodiment of the present invention.
Figure 38B:
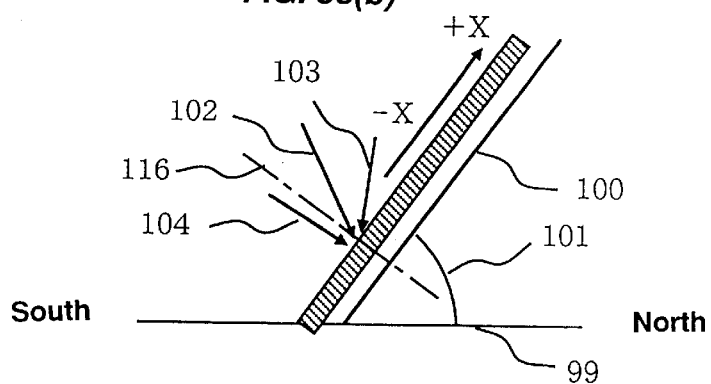
Figure 38C:
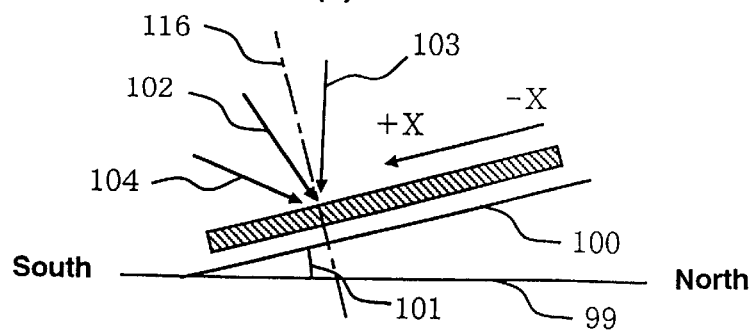

FIGS. 38(a) to 38(c) show the configuration of a concentrator photovoltaic module according to a ninth embodiment of the present invention. For a concentrator having the structure shown in FIG. 38(a), the light trapping efficiency of light 30 incident from the right, upper side of the figure, that is, tilted in the (+X)-direction becomes larger than the light trapping efficiency of light 31 incident from the left, upper side of the figure, that is, tilted in the (−X)-direction. FIGS. 38(b) and 38(c) each shows the vertical cross-section, taken in the direction from south to north, of the module established obliquely at a tilt angle 101 with respect to a horizontal plane 99. In this case, if the module is established such that sunlight 102 at the equinoxes is tilted from the normal line 116 of the light-incident plane of the module, the (+X)-direction of the module may correspond to the tilting direction of the sunlight 102 at the equinoxes as shown in FIGS. 38(b) and 38(c). This makes it possible to enhance the light trapping efficiency of the sunlight throughout the year. Also if the module is established such that the light-incident plane is directed to the north, the (+X)-direction of the module may be directed to the south. This also makes it possible to enhance the light trapping efficiency of the sunlight throughout the year. In this embodiment, since the tilt angle is set at an angle smaller than the latitude of the module establishing location, the module is set such that the (+X)-direction is directed to the south. In the above description, it is assumed that the module is located in the northern hemisphere; however, even in the case where the module is located in the southern hemisphere, the same effect can be obtained by reversing the south or north in the above description to the north or south.

Embodiment 10

Figure 39A:
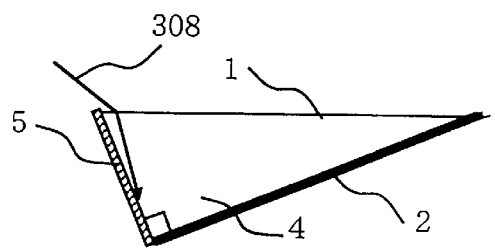
FIGS. 39(a) to 39(f) are views each showing the configuration of a concentrator photovoltaic device according to a tenth embodiment of the present invention, in which the surface structure of a photo detector is modified.
Figure 39B:
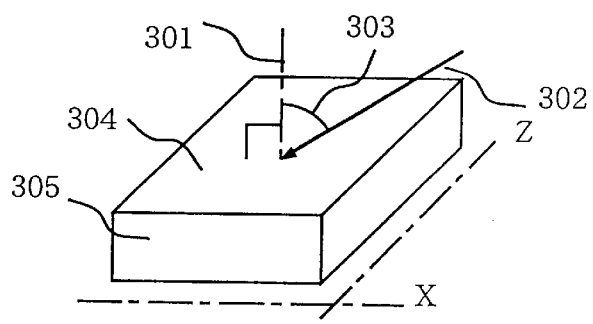
Figure 39C:
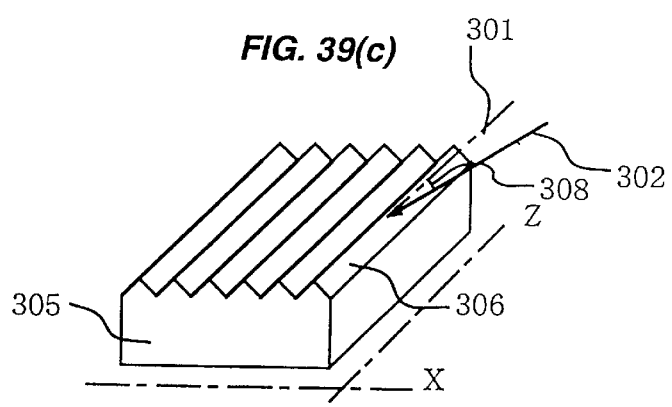
Figure 39D:
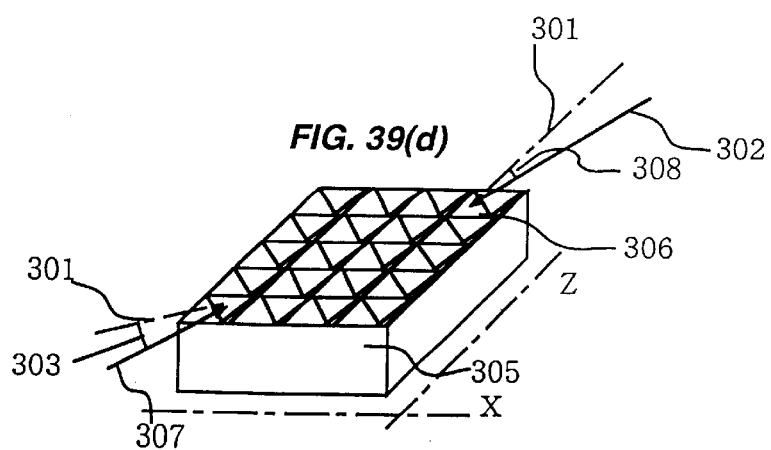
Figure 39E:
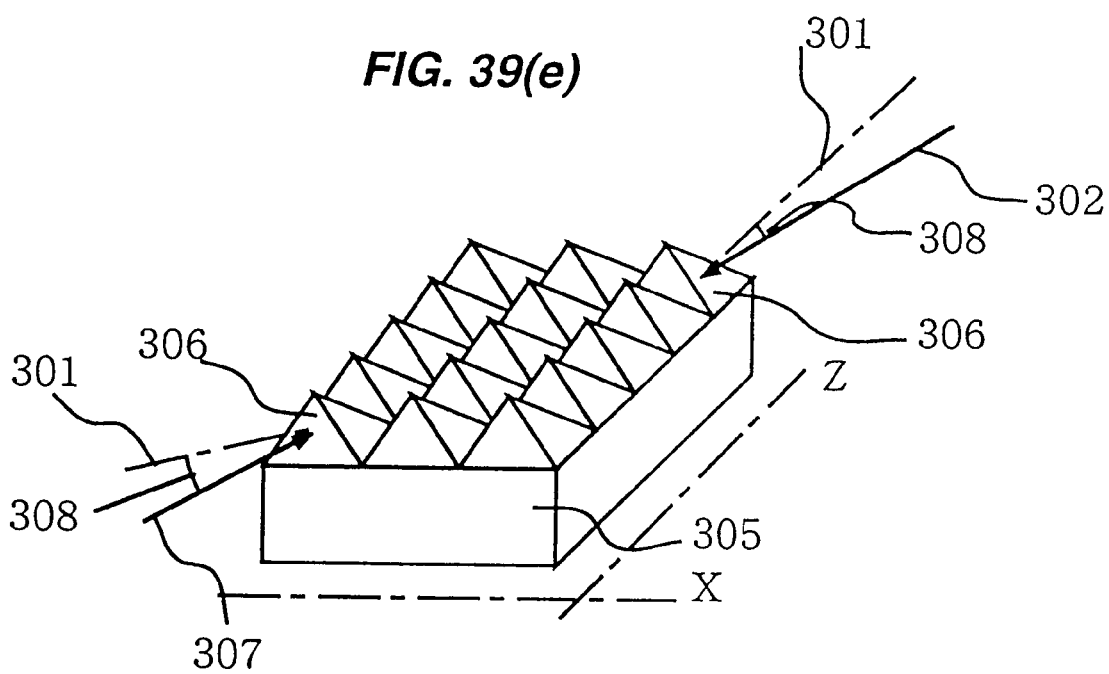
Figure 39F:
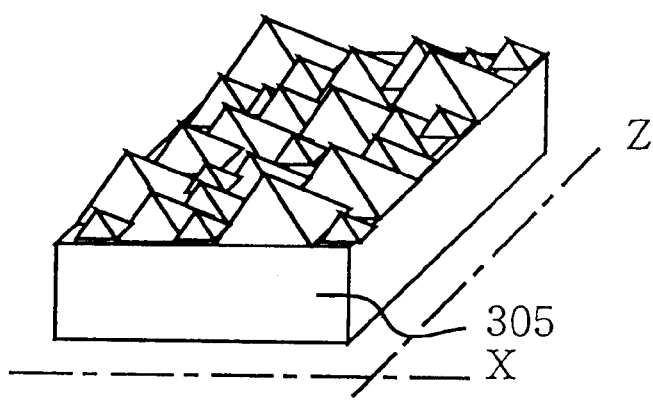

The structure of a tenth embodiment of the present invention will be described with reference to FIGS. 39(a) to 39(f). For example, as shown in FIG. 39(a), as the incident angle of light 308 incident on a light-incident plane 1 of a concentrator becomes larger, the incident angle of the light 308 incident on the surface of a photo detector 5 becomes larger. If the surface 304 of the photo detector 5 is flattened as shown in FIG. 39(b), as the angle of an incident light 302 with respect to the normal line 301 of the surface of the photo detector 5, that is, the incident angle 303 becomes larger, the surface reflection is generally becomes larger, to reduce the probability of trapping of the incident light in the photo detector 5. On the contrary, if the photo detector 5 is configured as a photo detector 305 having in its surface fine irregularities, such as V-grooves, extending in one direction as shown in FIG. 39(c), the incident angle 308 of the incident light 302 (which is made incident obliquely in the X-direction as shown in FIG. 39(b)) with respect to the normal line 301 of a slope 306 becomes smaller than the incident angle 303 of the incident light 302 shown in FIG. 39(b). In this way, as compared with the structure shown in FIG. 39(b), the structure shown in FIG. 39(c) is effective to suppress the incident angle of the light tilted in the X-direction at a small value. Also, if the surface of the photo detector has depressions formed into, for example, inverted-pyramid shapes as shown in FIG. 39(d), or has projections formed into, for example, pyramid shapes as shown in FIG. 39(e), it becomes possible to make smaller the incident angle, with respect to the normal line of the slope 306, of incident light tilted not only in the X-direction but also in the Z-direction. In this way, by forming fine irregularities having the shapes of grooves, projections or depressions in or on the surface of the photo detector, it is possible to reduce the reflectance of light incident on the surface of the photo detector at a larger incident angle and hence to increase the light trapping efficiency. This is effective to increase the output of the photo detector. As shown in FIG. 39(f), these fine irregularities may be configured such that the large and small projections/depressions be regularly or irregularly arranged, and that the slopes of the irregularities be flattened or curved. The structure in which the large and small projections/depressions are irregularly arranged is generally referred to as a "random pyramid surface". In this embodiment, the surface of the photo detector, configured as a crystalline silicon made photoelectric transducer, is subjected to anisotropic etching using a KOH solution to form a random pyramid structure as shown in FIG. 39(f) on the surface.

In the above description, the shape of the concentrator is specified into the plane, circular-arc, straight line, curved shape; however, such a shape may be practically offset from the above the plane, circular-arc, straight line, curved shape within the range of a manufacturing error. Also, the above shape may be partially offset for convenience of manufacture of the concentrator insofar as the shape does not largely obstruct the light trapping efficiency. Even in this case, there can be obtained the same effect of the present invention. Further, even in the case where a reflection preventive film such as an interference thin film may be formed on the surface of the photo detector, the same effect of the present invention can be of course obtained.

While the preferred embodiments of the present invention have been described using the specific terms, such description is for illustrative purposes only, and it is to be understood that changes and variations may be made without departing from the spirit or scope of the following claims.

What is claimed is:

1. A photovoltaic module comprising:
a plurality of concentrators each having a light-incident plane and a reflection plane and being connected such that said light-incident planes are continuous; and
photo detectors arranged such that at least part of the surface of each of said photo detectors is in contact with one of said concentrators and having a structure which can trap light in the photo detectors of adjacent concentrators after reflecting the incident light from one of said concentrators;
wherein the refractive index of said concentrator is larger than that of the environment outside said light-incident plane of said concentrator;
said concentrator has such a shape as to make the light trapping efficiency of first incident light different from the light trapping efficiency of second incident light, said first incident light and said second incident light being respectively tilted rightwardly and leftwardly from the normal line of said light-incident plane in a vertical cross-section including said light-incident plane, said reflection plane, and said photo detector; and
said plurality of concentrators are arranged such that a large-and-small relationship, in said plurality of concentrators, between the light trapping efficiency of said first incident light and the trapping efficiency of said second incident light corresponds to a large-and-small relationship, in one concentrator, between the light trapping efficiency of said first incident light and the light trapping efficiency of said second incident light.

2. A photovoltaic module according to claim 1, wherein said reflection plane has an interference thin film which enhances the reflectance thereof formed on the surface, on the inner side of said concentrator, of said reflection plane.

3. A photovoltaic module comprising:
a plurality of concentrators each having a light-incident plane and a reflection plane and being connected such that said light-incident planes are continuous; and
photo detectors arranged such that at least part of the surface of each of said photo detectors is in contact with one of said concentrators and having a structure which can trap light in the photo detectors of adjacent concentrators after reflecting the incident light from one of said concentrators;
wherein the refractive index of said concentrator is larger than that of the environment outside said light-incident plane of said concentrator;
two kinds of incident light, which have been made equiangularly, symmetrically incident on said light-incident plane at two points located equidistant from an arbitrary point on said light-incident plane in a vertical cross-section including said light-incident plane, said reflection plane and said photo detector, go along optical paths in said concentrators asymmetric to each other with respect to said arbitrary point; and
said plurality of concentrators are arranged such that a relationship between the two kinds of incident light going along the asymmetric optical paths is given for each of said plurality of concentrators.

4. A photovoltaic module according to claim 3, wherein said light-incident plane of said concentrator has irregularities.

5. A photovoltaic module according to claims 3, wherein the light-receiving plane of said photo detector has irregularities.

6. A photovoltaic module according to claim 3, wherein at least each connecting portion between adjacent two pieces of said concentrators is made from an elastic material and capable of being wound.

7. A photovoltaic module according to claim 3, wherein said photo detector is formed into a cylindrical or spherical shape.

8. A photovoltaic module according to claim 3, wherein said photo detector is formed into a hollow shape which is to be filled with a coolant.

9. A photovoltaic module according to claim 3, wherein said reflection plane has irregularities in the direction perpendicular to said vertical cross-section including said light-incident plane, said reflection plane and said photo detector.

10. A photovoltaic module according to claim 9, wherein depressions of said irregularities of said reflection plane have projections, and the projections have convex portions toward the side of said reflection plane, and the convex portions are formed of a curved line or a kinked line similar to the curved line.

11. A photovoltaic module according to claim 9, wherein said projections and depressions of said irregularities of the reflection plane are laterally symmetric to each other with respect to a point positioned in the direction of said projections and depressions.

12. A photovoltaic module according to claim 3, wherein said concentrator has a first medium in contact with said reflection plane and a second medium in contact with said first medium;

the refractive index of said first medium is different from that of said second medium; and the interface between said first and second media is formed into a shape with irregularities in the direction perpendicular to said vertical cross-section including said light-incident plane, said reflection plane and said photo detector.

13. A photovoltaic module according to claim 12, wherein depressions of said irregularities on the interface of said first medium and said second medium has a part of projection portions facing on said second medium side, and the projection portions are formed of a curved line or a kinked line similar to the curved line.

14. A photovoltaic module according to claim 12, wherein said projections and depressions of said irregularities on the interface of said first medium and said second medium are laterally symmetric to each other with respect to a point positioned in the direction of said projections and depressions.

15. A photovoltaic system using a photovoltaic module described in claim 3, comprising:

said photovoltaic module, wherein said photovoltaic module is established in a state in which sunlight at the equinoxes is tilted from the normal line of said light-incident plane of each of said concentrators; and wherein said first or second incident light side of each of said concentrators, corresponding to the larger one of the different light trapping efficiencies, of first incident light and second incident light, said first incident light and said second incident light being respectively tilted rightwardly and leftwardly from the normal line of said light-incident plane in the vertical cross-section including said light-incident plane, which are different due to said asymmetric optical paths of said two kinds of incident light, is directed in the tilting direction of said sunlight.

16. A photovoltaic module according to claims 3, wherein a part of said photo detectors elongates on the outside of said concentrator and a electrode is formed on the part of said photo detectors elongated on the outside of said concentrator.

17. A photovoltaic module comprising:

a plurality of concentrators each having a light-incident plane and a reflection plane and being connected such that said light-incident planes are continuous; and photo detectors arranged such that at least part of the surface of each of said photo detectors is in contact with one of said concentrators and having a structure which can trap a light in the photo detectors of adjacent concentrators after reflecting the incident light from one of said concentrators;

wherein the refractive index of said concentrator is larger than that of the environment outside said light-incident plane of said concentrator;

an angle formed between said light-incident plane and a linear portion of said reflection plane, in a vertical cross-section including said light-incident plane, said reflection plane and said photo detector, is less than 45°;

said photo detector is located opposite to a portion, crossing said linear portion of said reflection plane at said angle, of said light-incident plane in said vertical cross-section; and the connection of said plurality of concentrator are arranged such that said portions, each crossing said linear portion of said reflection plane at said angle, of said light-incident planes and said photo detectors are alternately arranged.

18. A photovoltaic module according to claim 17, wherein said photo detector is mounted such that a light-receiving plane of said photo detector is located at a position having a plane portion parallel to said light-incident plane.

19. A photovoltaic module according to claim 17, wherein said photo detector is mounted such that a light-receiving plane of said photo detector is located at a position having a plane portion perpendicular to said light-incident plane.

20. A photovoltaic module according to claim 17, wherein said photo detector is mounted at a position at which a light-receiving plane of said photo detector crosses said light-incident plane at a non-right angle.

* * * * *